United States Patent
Yamazaki et al.

(10) Patent No.: US 6,509,602 B2
(45) Date of Patent: Jan. 21, 2003

(54) NONVOLATILE MEMORY AND MANUFACTURING METHOD THEREOF

(75) Inventors: Shunpei Yamazaki, Tokyo (JP); Jun Koyama, Kanagawa (JP); Keisuke Hayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/988,729

(22) Filed: Nov. 20, 2001

(65) Prior Publication Data

US 2002/0070406 A1 Jun. 13, 2002

Related U.S. Application Data

(62) Division of application No. 09/156,913, filed on Sep. 18, 1998.

(30) Foreign Application Priority Data

Sep. 20, 1997 (JP) ................................................ 9-273454
May 22, 1998 (JP) ............................................ 10-158315

(51) Int. Cl.$^7$ ............................................... H01L 29/76
(52) U.S. Cl. ........................ 257/314; 257/57; 257/59; 257/314; 257/315; 257/316; 257/317; 257/347; 438/201; 438/211; 438/257; 438/266
(58) Field of Search .......................... 257/57, 59, 314, 257/315, 316, 317, 347; 438/201, 211, 257, 266

(56) References Cited

U.S. PATENT DOCUMENTS

| | | | | |
|---|---|---|---|---|
| 5,308,999 A | * | 5/1994 | Gotou | ........................ 257/66 |
| 5,341,012 A | * | 8/1994 | Misawa et al. | ............. 257/351 |
| 5,440,158 A | | 8/1995 | Sung-Mu | |
| 5,541,876 A | | 7/1996 | Hsue et al. | |
| 5,543,340 A | * | 8/1996 | Lee | .............................. 437/44 |

(List continued on next page.)

FOREIGN PATENT DOCUMENTS

| | | | | |
|---|---|---|---|---|
| JP | 04-130668 | | 5/1992 | |
| JP | 04-279064 | * | 10/1992 | ................. 257/347 |
| JP | 05-275652 | | 10/1993 | |
| JP | 06-085258 | | 3/1994 | |
| JP | 06-125084 | * | 5/1994 | ................. 257/347 |

(List continued on next page.)

OTHER PUBLICATIONS

Specifications and Drawings for application Ser. No. 08/633,307, "A Method for Manufacturing a Semiconductor Device".
Specifications and Drawings for application Ser. No. 08/928,514, "A Method for Manufacturing a Semiconductor Device".
Specifications and Drawings for application Ser. No. 09/084,738, "Semiconductor Thin Film & Semiconductor Device".
Specifications and Drawings for application Ser. No. 09/645,329, "Semiconductor Thin Film & Semiconductor Device".
Specifications and Drawings for application Ser. No. 09/592,936, "Semiconductor Thin Film & Semiconductor Device".

*Primary Examiner*—Allan R. Wilson
*Assistant Examiner*—Edgardo Ortiz
(74) *Attorney, Agent, or Firm*—Nixon Peabody LLP; Jeffrey L. Costellia

(57) ABSTRACT

Memory elements, switching elements, and peripheral circuits to constitute a nonvolatile memory are integrally formed on a substrate by using TFTs. Since semiconductor active layers of memory element TFTs are thinner than those of other TFTs, impact ionization easily occurs in channel regions of the memory element TFFs. This enables low-voltage write/erase operations to be performed on the memory elements, and hence the memory elements are less prone to deteriorate. Therefore, a nonvolatile memory capable of miniaturization can be provided.

30 Claims, 18 Drawing Sheets

U.S. PATENT DOCUMENTS

| | | |
|---|---|---|
| 5,643,826 A | 7/1997 | Ohtani et al. |
| 5,648,277 A | 7/1997 | Zhang et al. |
| 5,671,026 A | 9/1997 | Shiraki et al. |
| 5,818,070 A | 10/1998 | Yamazaki et al. |
| 5,834,797 A | 11/1998 | Yamanaka |
| 5,895,935 A | 4/1999 | Yamazaki et al. |
| 5,923,962 A | 7/1999 | Ohtani et al. |
| 5,925,906 A | 7/1999 | Tanaka |
| 5,962,896 A | 10/1999 | Yabuta et al. |
| 5,994,717 A | 11/1999 | Igarashi et al. |
| 6,013,928 A | 1/2000 | Yamazaki et al. |
| 6,054,734 A * | 4/2000 | Aozasa ................ 257/315 |
| 6,087,679 A | 7/2000 | Yamazaki et al. |
| 6,133,967 A * | 10/2000 | Moon ................ 349/39 |
| 6,140,667 A | 10/2000 | Yamazaki et al. |
| 6,160,271 A | 12/2000 | Yamazaki et al. |
| 6,288,412 B1 * | 9/2001 | Hamada et al. ........... 257/59 |

FOREIGN PATENT DOCUMENTS

| | | | |
|---|---|---|---|
| JP | 07-130652 | 5/1995 | |
| JP | 07-135318 | 5/1995 | |
| JP | 07-193246 | * 7/1995 | ........... 257/347 |
| JP | 07-321339 | 12/1995 | |
| JP | 08-078329 | 3/1996 | |
| JP | 11-284188 | * 10/1999 | ........... 257/347 |

* cited by examiner

5nm

5nm 0.1μm 0.1μm

2μm

2μm 50 nm

<Point 1>

5 nm 50 nm

<Point 2>

5 nm 50 nm

<Point 3>

5 nm

NONVOLATILE MEMORY AND MANUFACTURING METHOD THEREOF

This application is a divisional of 09/156,913 filed on Sep. 18, 1998.

BACKGROUND OF THE INVENTION

1. Field of the Invention

The present invention relates to a nonvolatile memory using thin-film transistors that are formed by using the SOI (silicon on insulator) technology and, particularly, to an EEPROM (electrically erasable and programmable read-only memory) that is formed on an insulative substrate so as to be integral with its peripheral circuits such as a driver circuit. The term "silicon" as used above means a silicon single crystal or a silicon semiconductor that is substantially a single crystal.

2. Description of the Related Art

In recent years, the miniaturization of semiconductor devices have required memories that has high performance and large storage capacity and is small in size. Currently, among various storage devices for semiconductor devices, the magnetic disk and the semiconductor nonvolatile memory manufactured by using bulk silicon are used most frequently.

Although the magnetic disk is one of storage devices having the largest storage capacity among those used for semiconductor devices, it has disadvantages of difficulty in miniaturization and slow write and read speeds.

On the other hand, although at present the semiconductor nonvolatile memory is lower in storage capacity than the magnetic disk, its read and write speeds are tens of times higher than the magnetic disk. Further, semiconductor nonvolatile memory products having sufficient performance also in the number of allowable rewrite operations and data holding time have been developed recently. This has caused a tendency of using a semiconductor memory as a replacement of a magnetic disk.

However, conventionally, the semiconductor nonvolatile memory is manufactured by using bulk silicon and accommodated in a package. Therefore, when such a semiconductor nonvolatile memory is mounted on a semiconductor device, the number of manufacturing steps increases and a large-sized package is an obstacle to miniaturization of the semiconductor device.

SUMMARY OF THE INVENTION

The present invention has been made in view of the above circumstances, and an object of the invention is therefore to provide a nonvolatile memory which can be formed so as to be integral with other parts of a semiconductor device and allows its miniaturization.

To attain the above object, according to a first aspect of the invention, there is provided a nonvolatile memory in which memory cells each including a memory TFT and a switching TFT are arranged in matrix form, wherein the memory TFT comprises a semiconductor active layer formed on an insulative substrate, a gate insulating film, a floating gate electrode, an anodic oxide film formed by anodizing the floating gate electrode, and a control gate electrode; the switching TFT comprises a semiconductor active layer formed on the insulative substrate, a gate insulating film, and a gate electrode; and the memory TFT and the switching TFT are integrally formed on the insulative substrate, and the semiconductor active layer of the memory TFT is thinner than that of the switching TFT.

The semiconductor active layers of the memory TFT and the switching TFT may have a thickness of 150 nm or less.

The semiconductor active layers of the memory TFT and the switching TFT may have thicknesses of 1–50 nm and 40–100 nm, respectively.

The semiconductor active layer of the memory TFT may have a thickness of 10–40 nm.

The semiconductor active layer of the memory TFT may have such thickness that impact ionization occurs more easily than that of the switching TFT.

A tunnel current flowing through the semiconductor active layer of the memory TFT may be two times or more larger than that flowing through the semiconductor active layer of the switching TFT.

To attain the above object, according to a second aspect of the invention, there is provided a nonvolatile memory in which memory cells each including a memory TFT and a switching TFT are arranged in matrix form, wherein the memory TFT comprises a control gate electrode formed on an insulative substrate, a first insulating film, a floating gate electrode, a second insulating film, and a semiconductor active layer; the switching TFT comprises a gate electrode formed on the insulative substrate, a first insulating film, and a semiconductor active layer; and the memory TFT and the switching TFT are integrally formed on the insulative substrate, and the semiconductor active layer of the memory TFT is thinner than that of the switching TFT.

The semiconductor active layers of the memory TFT and the switching TFT may have a thickness of 150 nm or less.

The semiconductor active layers of the memory TFT and the switching TFT may have thicknesses of 1–50 nm and 40–100 nm, respectively.

The semiconductor active layer of the memory TFT may have a thickness of 10–40 nm.

The semiconductor active layer of the memory TFT may have such thickness that impact ionization occurs more easily than that of the switching TFT.

A tunnel current flowing through the semiconductor active layer of the memory TFT may be two times or more larger than that flowing through the semiconductor active layer of the switching TFT.

To attain the above object, according to a third aspect of the invention, there is provided a manufacturing method of a nonvolatile memory, comprising the steps of forming first and second amorphous silicon films having different thicknesses; crystallizing the first and second amorphous silicon films into first and second crystalline silicon films having first and second thicknesses, respectively, the first thickness being smaller than the second thickness; and forming a memory TFT and a switching TFT on the first and second crystalline silicon films, respectively.

The first and second thicknesses may be 150 nm or less.

The first and second thicknesses may be 1–50 nm and 40–100 nm, respectively.

The first thickness may be 10–40 nm.

The first and second thicknesses may be so set that impact ionization occurs more easily in the first crystalline silicon film than in the second crystalline silicon film.

A tunnel current flowing through the semiconductor active layer of the memory TFT may be two times or more larger than that flowing through the second crystalline silicon film.

BRIEF DESCRIPTION OF THE DRAWINGS

FIGS. 3A–3D, 4A–4D, 5A–5D, 6A–6D, and 7A–7D show a manufacturing process of a nonvolatile memory according to the first embodiment;

FIGS. 9A–9D, 10A–10D, and 11A–11D show a manufacturing process of a nonvolatile memory according to a fourth embodiment of the invention;

DETAILED DESCRIPTION OF THE PREFERRED EMBODIMENTS

Embodiment 1

This embodiment is directed to a nonvolatile memory formed on an insulative substrate, particularly an EEPROM. An EEPROM according to this embodiment is formed on an insulative substrate so as to be integral with its peripheral circuits such as a driver circuit.

Figure 1:
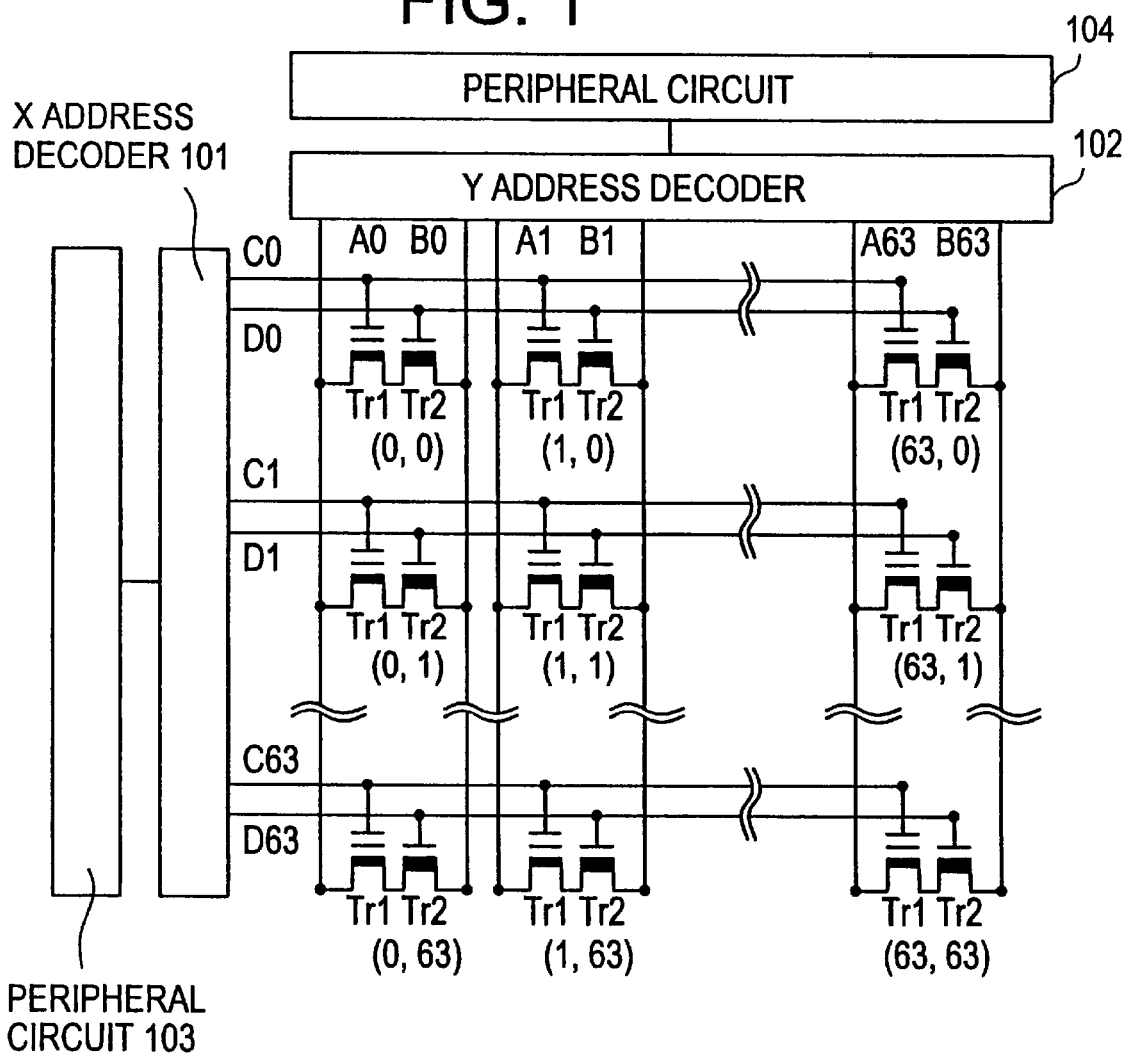
FIG. 1 is a circuit diagram of a nonvolatile memory according to a first embodiment of the present invention.

FIG. 1 is a circuit diagram of a 4-kilobit EEPROM according to this embodiment. As shown in FIG. 1, the 4-kilobit EEPROM according to this embodiment is composed of a plurality of electrically erasable memory elements Tr1, a plurality of switching elements Tr2, X and Y address decoders 101 and 102, and other peripheral circuits 103 and 104. The peripheral circuits 103 and 104 include an address buffer circuit and a control logic circuit and are provided when necessary. Each memory element (storage element) Tr1, which stores bit information in FIG. 1, is a p-channel nonvolatile memory element having a floating gate. Each switching element Tr2 is an n-channel switching element.

The drain electrodes of two TFTs (TR1 and Tr2) are connected to each other in series and this series circuit constitutes a 1-bit memory cell. In this embodiment, memory cells each having such a structure are arranged in a matrix of 64 ×64 (vertical/horizontal). Since each memory cell can store 1-bit information, the EEPROM of this embodiment has a storage capacity of 4,096 bits (about 4 kilobits). Although this embodiment is directed to the 4,096-bit EEPROM, the invention can be utilized in constructing an EEPROM of any storage capacity.

Both ends of memory cells arranged on each column are connected to signal lines A0 and B0 to A63 and B63. The gate electrodes of memory cells arranged on each row are connected to signal lines C0 and D0 to C63 to D63. In this embodiment, the respective memory cells constituting the 4-kilobit EEPROM are given symbols (0, 0), (1, 0), ..., and (63, 63) as shown in FIG. 1.

The signal lines A0/B0 to A63 and B63 are connected to the Y address decoder 102 and the signal lines C0,D0 to C63 to D63 are connected to the X address decoder 101. A particular memory cell is designated by the X address decoder 101 and the Y address decoder 102 and data is written to it or read or erased from it.

Figure 2:
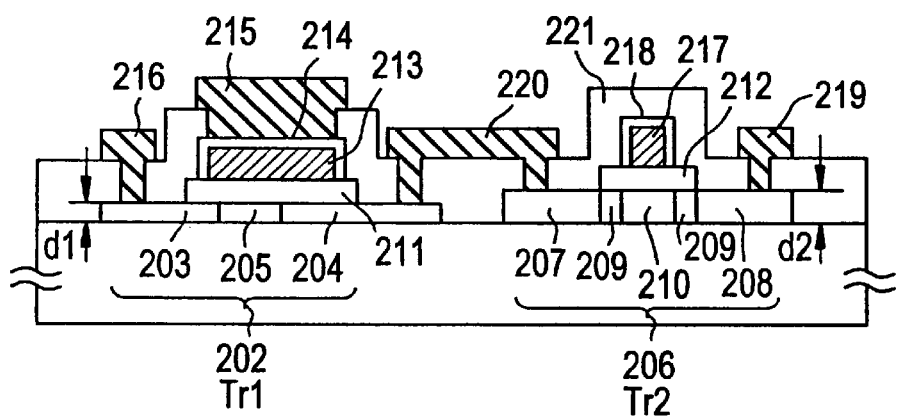
FIG. 2 is a sectional view of a memory element and a switching element constituting the nonvolatile memory of FIG. 1.

The configuration of each memory cell according to this embodiment will be described below with reference to FIG. 2, which is a sectional view of a memory cell according to this embodiment. In FIG. 2, the left-hand element is a memory element Tr1 and the right-hand element is a switching element Tr2. A semiconductor active layer 202 of the memory element Tr1 includes a source region 203, a drain region 204, and a channel region 205. A semiconductor active layer 206 of the switching element Tr2 includes a source region 207, a drain region 208, low-concentration impurity regions 209, and a channel region 210. Reference numerals 211 and 212 denote gate insulating films; 213, a floating gate electrode; 214 and 218, anodic oxide films; 215, a control gate electrode; 216 and 220, source electrodes; 219, a drain electrode; and 221, an interlayer insulating film.

As shown in FIG. 2, the thickness d1 of the semiconductor active layer 202 of the memory element Tr1 is different from the thickness d2 of the semiconductor active layer 206 of the switching element Tr2, that is, d1<d2. This structure facilitates impact ionization in the semiconductor active layer 202 of the memory element Tr1 more than Tr2, which in turn facilitates charge injection into the floating gate electrode 213 of the memory element Tr1. Further, it is preferable that tunnel current flowing through the semiconductor active layer of the memory element be two times or more larger than that flowing through the semiconductor active layer of the switching element. This allows writing and erasure to be performed on the memory element at a low voltage and thereby decrease the rate of deterioration of the memory element with respect to the number of write operations on the memory element.

Semiconductor active layers of TFTs constituting the X and Y address decoders 101 and 102 and TFTs constituting other peripheral circuits have basically the same thickness as the semiconductor active layer of the switching TFT Tr2.

The operation of the EEPROM according to this embodiment will be described below by taking the memory cell (1, 1) as an example.

First, to write data to the memory cell (1, 1), a voltage −5 V is applied to the signal line A1 and a voltage 5 V is applied to the signal line D1. If the signal line B1 is grounded and a high voltage of about 20 V is applied to the signal line C1 in this state, carriers (in this case, holes) moving through the channel region of the memory element Tr1 are accelerated and weak avalanche breakdown or impact ionization occurs to cause a large number of high-energy hot carriers (electrons). These carriers are injected into the gate insulating film 211 and trapped in the floating gate electrode 213.

In this manner, charge is accumulated in the floating gate electrode 213 of the memory element Tr1 and its threshold voltage is thereby varied.

Next, to read data from the memory cell (1, 1), 0 V is applied to the signal line C1 and 5 V is applied to the signal line D1. If the signal line B1 is grounded in this state, the threshold voltage of the memory element Tr1 is varied depending on whether charge is accumulated in the floating gate electrode 213, and a stored signal is read out from the signal line A1.

Next, to erase data stored in the memory cell (1, 1), 5 V is applied to the signal line D1 and the signal line B1 is grounded. If a voltage of about −20 V is applied to the signal line C1 in this state, electrons trapped in the floating gate electrode 213 are injected into the drain region 204, whereby stored data is erased.

Table 1 summarizes the above operations.

TABLE 1

|  | A1 (V) | B1 (V) | C1 (V) | D1 (V) |
|---|---|---|---|---|
| Writing | 0/−5 | GND | 20 | −5 |
| Reading | — | GND | 0 | −5 |
| Erasure | — | GND | −20 | −5 |

The voltages to be applied to the memory element depend on the thickness of the semiconductor active layer of the memory element, the capacitance between the control gate electrode and the floating gate electrode, and other factors. Therefore, the operation voltages of the memory element are not limited to the above values.

The number of allowable rewrite operations and the information holding time are important characteristics of the EEPROM. To increase the number of allowable rewrite operations, the voltage applied to the control gate electrode of the memory element needs to be small. Since the semiconductor active layer of the memory element of this embodiment is thinner than the semiconductor active layers of the switching TFT and the TFTs constituting the address decoders 101 and 102, impact ionization easily occurs there and hence the voltage to be applied to the control gate electrode 215 can be set low.

In this embodiment, when data is written to or erased from the memory element Tr1, pulses lower than 20 V may be applied to the control gate electrode 215 of the memory element Tr1 a plurality of times rather than a voltage 20 V is applied thereto once. This prevents deterioration of the memory element Tr1.

The TFT to constitute the EEPROM according to this embodiment is required to be superior in mobility, threshold voltage, and other characteristics. Therefore, TFTs having an amorphous silicon semiconductor active layer, which are commonly used conventionally, are insufficient in performance. A method for manufacturing TFTs exhibiting such superior characteristics will be described below. The following manufacturing method enables manufacture of TFTs having superior characteristics and thereby realizes the EEPROM according to this embodiment.

A manufacturing method of the EEPROM according to this embodiment will be described below with reference to FIGS. 3A–3D to 7A–7B. In these figures, a memory element and a switching element that constitute a memory cell and two TFTs constituting a CMOS circuit that is typical of circuits to constitute the address decoders 101 and 102 and other peripheral circuits are used as examples of the TFTs that constitute the EEPROM according to this embodiment.

It will be understood that according to the following manufacturing method of a nonvolatile memory the non-volatile memory of this embodiment can be formed integrally with any semiconductor device that can be manufactured by the thin-film technology.

Figure 3A:
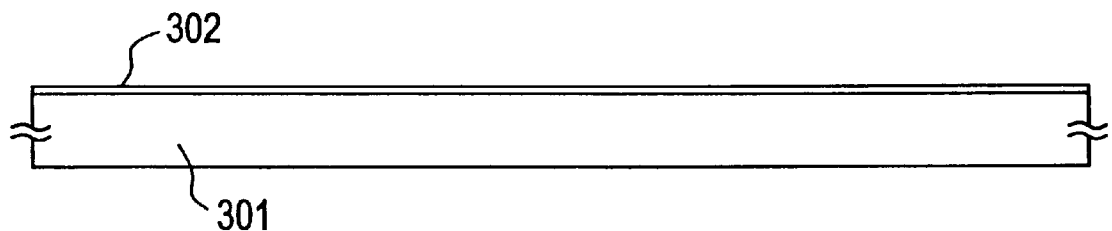

As shown in FIG. 3A, first a quartz substrate 301 is prepared as a substrate having an insulative surface. Alternatively, a silicon substrate formed with a thermal oxide film may be used. As a further alternative, an amorphous silicon film may be formed on a quartz substrate and then thermally oxidized in its entirety into an insulating film. It is also possible to use a quartz substrate or a ceramic substrate formed with a silicon nitride film as an insulating film.

Then, a 25-nm-thick amorphous silicon film 302 is formed (see FIG. 3A). In this embodiment, the film is formed by low-pressure CVD under the following conditions:

film forming temperature: 465° C.
film forming pressure: 0.5 Torr; and
film forming gases: He (helium) 300 sccm $Si_2H_6$ (disilane) 250 sccm.

Figure 3B:
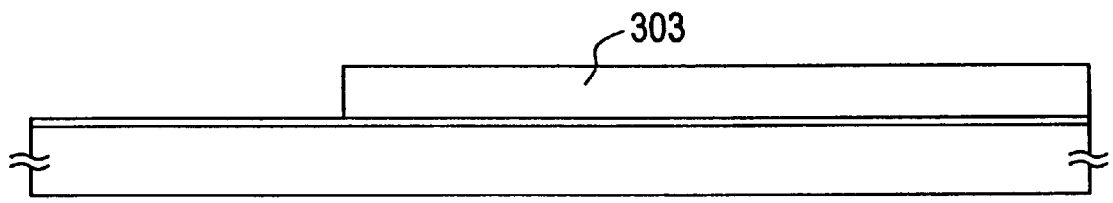
Figure 3C:
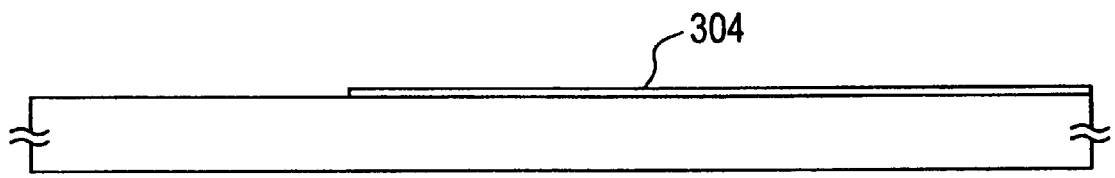

Thereafter, a resist film is formed and then patterned into a mask 304 (see FIG. 3B). Subsequently, the amorphous silicon film 303 is etched to form an amorphous silicon film 304 that occupies part of the surface of the substrate 301 (see FIG. 3C). The amorphous silicon film 303 may be etched by either dry etching or wet etching. In the case of dry etching, $CF_4+O_2$ may be used. In the case of wet etching, hydrofluoric acid plus nitric acid may be used.

Figure 3D:
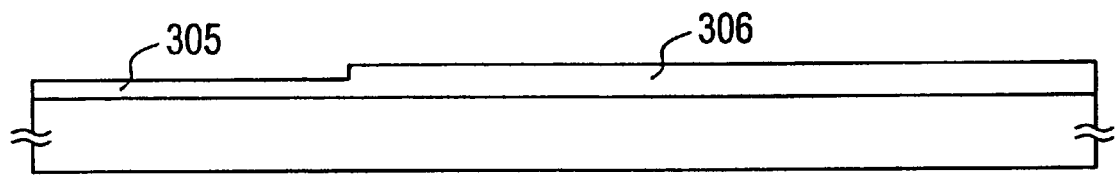

Then, a 50-nm-thick amorphous silicon film is again formed by the above-described method, to form amorphous silicon films 305 and 306 as shown in FIG. 3D. In this embodiment, adjustments are so made that the amorphous silicon films 305 and 306 will have final thicknesses (i.e., thicknesses after thickness reduction due to thermal oxidation) of 50 nm and 75 nm, respectively.

It is desirable that the surfaces of the amorphous silicon film 304 and the quartz substrate 301 be cleared before the second formation of an amorphous silicon film.

The amorphous silicon films 305 and 306 may be formed by another method. For example, a 75-nm-thick amorphous silicon film is formed over the entire surface by the above-described method, a mask is formed so as to cover part of it, and the amorphous silicon film is etched in the above-described method so as to be reduced in thickness partially.

The amorphous silicon film 305 will become a semiconductor active layer of a memory element and the amorphous silicon film 306 will become semiconductor active layers of a switching element and a peripheral CMOS circuit or the like.

If the final thicknesses of the semiconductor active layers are 150 nm or more, particularly 200 nm or more, the degree of impact ionization that is characteristic of the SOI structure would be extremely low, that is, as low as in a nonvolatile memory using bulk silicon. Therefore, in the invention, it is preferable that the final thicknesses of both kinds of semiconductor active layers be 150 nm or less (preferably 100 nm or less).

Although in this embodiment the final thicknesses of the amorphous silicon film 305 for a memory element and the amorphous silicon film 306 for a switching element and a peripheral CMOS circuit or the like are set to 50 nm and 75 nm, respectively, in the invention they are not limited to those values. The thicknesses of the amorphous silicon films 305 and 306 may preferably be set in ranges of 1–50 nm (even preferably 10–40 nm) and 40–100 nm, respectively.

In forming the amorphous silicon films, it is important to throughly manage the concentrations of impurities in the films. In this embodiment, management is so made that the concentrations of C (carbon) and N (nitrogen) in the amorphous silicon films 305 and 306 become lower than $5\times10^{18}$ atoms/cm$^3$ (typically $5\times10^{17}$ atoms/cm$^3$ or less, preferably $2\times10^{17}$ atoms/cm$^3$ or less) and the concentration of O (oxygen) become lower than $1.5\times10^{19}$ atoms/cm$^3$ (typically $1\times10^{18}$ atoms/cm$^3$ or less, preferably $5\times10^{17}$ atoms/cm$^3$ or less). (C, N, and O are crystallization-obstructing impurities.) This is because if each impurity exists at a concentration higher than the above value, it will adversely affect later crystallization to thereby degrade the quality of crystallized films. In this specification, the concentration of an impurity element in a film, like the above concentrations, is defined as the minimum value of SIMS (secondary ion mass spectroscopy) measurement values.

For the above concentration management, it is desirable that a low-pressure CVD furnace used in this embodiment be subjected to dry cleaning on a regular basis so that a film forming chamber be kept clean. The dry cleaning may be performed in such a manner that a ClF$_3$ (chlorine fluoride) gas is introduced at 100–300 sccm into the furnace that is heated to 200°–400° C. so that the film forming chamber is cleaned by fluorine that is generated through thermal decomposition.

According to the knowledge of the inventors, attached substances (mainly made of silicon) of about 2 μm in thickness can be removed completely in 4 hours when the furnace inside temperature and the flow rate of a ClF$_3$ gas are set to 300° C. and 300 sccm, respectively.

The concentration of hydrogen in the amorphous silicon films 305 and 306 is also a very important parameter. Films having higher crystallinity can be obtained by making the hydrogen content lower. To this end, it is preferably to form the amorphous silicon films 305 and 306 by low-pressure CVD. Plasma CVD can also be used if the film forming conditions are optimized.

Then, the amorphous silicon films 305 and 306 are crystallized by using a technique disclosed in Japanese Patent Laid-Open No. Hei. 7-130652 of the present inventors. Although either of the techniques disclosed in the first and second embodiments of this publication may be used, in the invention it is preferable to use the technique of the second embodiment (disclosed in more detail in Japanese Patent Laid-Open No. Hei. 8-78329).

Figure 4A:
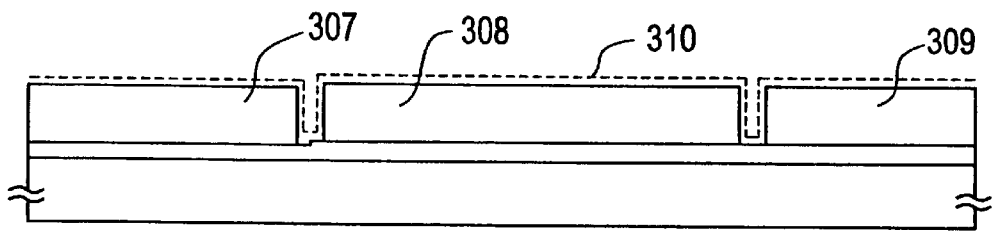

In the technique of the publication No. Hei. 8-78329, first mask insulating films 307–309 for selecting regions where to add a catalyst element are formed. Thereafter, a solution containing nickel (Ni) as a catalyst element for accelerating crystallization of the amorphous silicon films 305 and 306 is applied by spin coating, to form a Ni-containing layer 310 (see FIG. 4A).

Other examples of the catalyst element are cobalt (Co), iron (Fe), palladium (Pd), platinum (Pt), copper (Cu), gold (Au), germanium (Ge), lead (Pb), indium (In) and the like.

The catalyst element adding method is not limited to spin coating and may be ion implantation or plasma doping using a resist mask. The use of ion implantation or plasma doping is effective in constructing a miniaturized circuit because it is easy to reduce the areas occupied by catalyst-element-added regions and to control the growth distance of a lateral growth region.

After the completion of the catalyst element adding step, hydrogen removal is performed at 450° C. for about 1 hour. Subsequently, the amorphous silicon films 305 and 306 are crystallized by performing a heat treatment at 500°–700° C. (typically 550°–650° C.) for 4–24 hours in an inert atmosphere, a hydrogen atmosphere, or an oxygen atmosphere. In this embodiment, a heat treatment is performed at 570° C. for 14 hours in a nitrogen atmosphere.

Figure 4B:
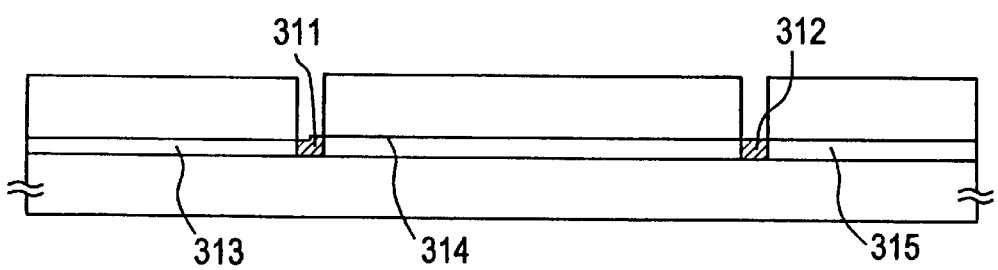

In this step, the crystallization of the amorphous silicon films 305 and 306 proceeds with priority from nuclei that are generated in regains 311 and 312 where nickel is added, whereby crystal regions 313–315 are formed that have grown approximately parallel with the surface of the substrate 301 (see FIG. 4B). The inventors call the crystal regions 313–315 lateral growth regions. The lateral growth region has an advantage of superior overall crystallinity because it is a collection of individual crystals that are relatively similar in crystallinity.

Figure 4C:
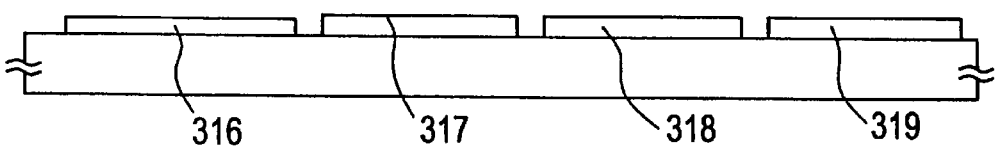

After the completion of the heat treatment for crystallization, the mask insulating films 307–309 are removed. Then, patterning is performed to form island-like semiconductor layers (active layers) 316–319 made from only the lateral growth regions (see FIG. 4C).

Then, after a channel forming region of the island-like semiconductor active layer 316 and the other island-like semiconductor active layers 317–319 are covered with resist masks 320 and 321, impurity ions for imparting p-type conductivity are added. Although B (boron) is used as the impurity element, In (indium) may also be used. The acceleration voltage at the time of the impurity addition is set to about 80 kV.

Figure 4D:
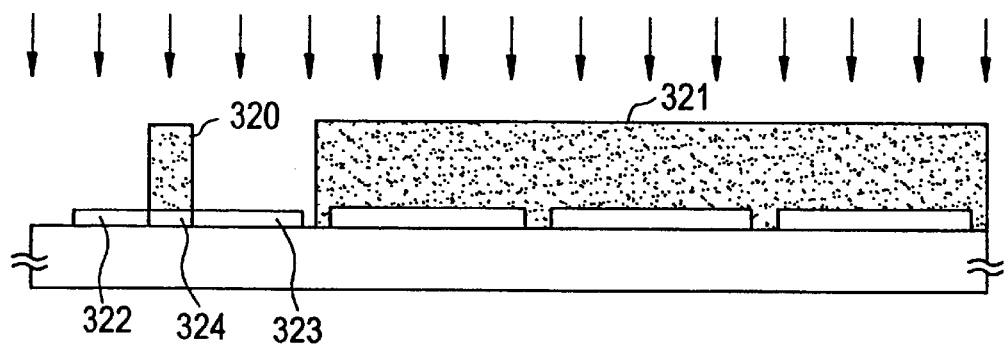

As a result, a source region 322, a drain region 323, and a channel forming region 324 are formed in the island-like semiconductor active layer 316. Since the island-like semiconductor active layers 317–319 are covered with the resist mask 321, the impurity is not added thereto (see FIG. 4D).

Figure 5A:
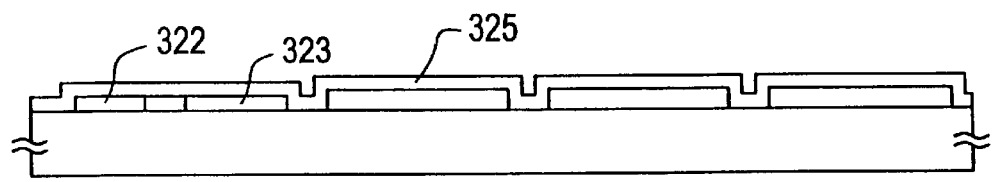

Then, after the resist masks 320 and 321 are removed, a gate insulating film is formed that is an insulating film 325 containing silicon (see FIG. 5A). The thickness of the gate insulating film 325 may be adjusted in a range of 10–250 nm (thickness increase in a later thermal oxidation step is taken into account). The thickness of the gate insulating film 325 on the island-like semiconductor active layer 316 for a memory element may be set to 10–50 nm and the other portion may be set to 50–250 nm. The gate insulating film 325 may be made of SiO$_2$, SiON, SiN, or the like. The film forming method may be a known vapor-phase method (plasma CVD, sputtering, or the like).

Then, to remove or reduce the concentration of the catalyst element (nickel), a heat treatment (catalyst element gettering process) is performed as shown in FIG. 5A. In this heat treatment, to utilize a metal element gettering effect of a halogen element, a halogen element is added to a processing atmosphere.

To fully utilize the gettering effect of the halogen element, it is preferable that the heat treatment be performed at a temperature higher than 700° C. If the temperature is lower than 700° C., the halogen element in the processing atmosphere is hard to decompose and the gettering effect may not be obtained. Therefore, it is preferable that the heat treatment temperature and the processing time be set to 800°–1000° C. (typically 950° C.) and 0.1–6 hours (typically 0.5–1 hour). In the heat treatment, it is necessary to take a proper measure to prevent impurities in the source and drain regions 322 and 323 from diffusing into the channel region 324.

In a typical embodiment, a heat treatment is performed at 950° C. for 30 minutes in an oxygen atmosphere containing a hydrogen chloride (HCl) gas at 0.5–10 vol % (in this embodiment, 3 vol %). A HCl content higher than this range is not preferable because asperities whose height is on the order of the thickness are formed on the surface of the active layers 316–319.

Other than HCl, the compound containing a halogen element may be one or a plurality of compounds selected from HF, $NF_3$, HBr, $Cl_2$, $ClF_3$, $BCl_3$, $F_2$, $Br_2$ and the like.

In this step, nickel in the active layers 316–319 are removed in such a manner that it is gettered by the action of chlorine and desorbed into the air in the form of nickel chloride which is volatile. As a result of this step, the nickel concentration of the active layers 316–319 is reduced to $5 \times 10^{17}$ atoms/$cm^3$ or less (typically $2 \times 10^{17}$ atoms /$cm^3$ or less). According to the experience of the present inventors, no adverse effects occur in the TFT characteristics as long as the nickel concentration is $1 \times 10^{18}$ atoms/$cm^3$ or less (preferably $5 \times 10^{17}$ atoms/$cm^3$ or less).

The above gettering process is also effective for metal elements other than nickel. Metal elements that may be mixed into the silicon films are mainly elements that constitute the film forming chamber (typically, aluminum, iron, and chromium). The concentrations of those metal elements can also be reduced to $5 \times 10^{17}$ atoms/$cm^3$ or less (preferably $2 \times 10^{17}$ atoms/$cm^3$ or less) by executing the above gettering process.

After the above gettering process, the halogen element that was used in the gettering process remains in the active layers 316–319 at a concentration of $1 \times 10^{16}$ to $1 \times 10^{20}$ atoms/$cm^3$.

In the above heat treatment, a thermal oxidation reaction proceeds at the interfaces between the gate insulating film 325 and the active layers 316–319, whereby the thickness of the gate insulating film 325 is increased by the thickness of a thermal oxidation film. By forming a thermal oxidation film in this manner, a semiconductor/insulating film interface where the concentration of interface states is very low can be obtained. Another advantage can be obtained that improper formation of a thermal oxidation film (edge thinning) at the end portions of the active layers 316–319 can be prevented.

It is effective to improve the film quality of the gate insulating film 325 by performing a heat treatment at 950° C. for about 1 hour in a nitrogen atmosphere after the above heat treatment in a halogen-containing atmosphere.

Figure 5B:
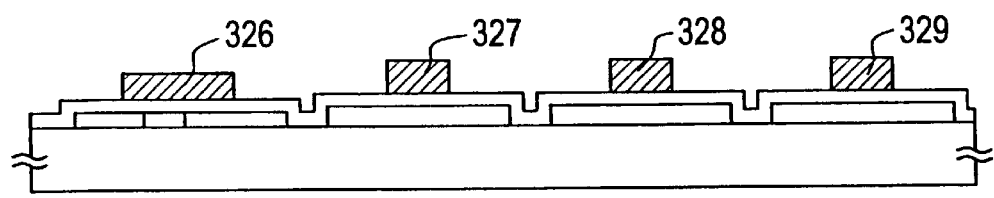

Thereafter, a metal film (not shown) having aluminum as the main component is formed and then patterned into starting members 326–329 for later gate electrodes (see FIG. 5B). In this embodiment, an aluminum film containing scandium at 2 wt % is used. Alternatively, a tantalum film, a conductive silicon film, or the like may be used.

In this state, a technique disclosed in Japanese Patent Laid-Open No. Hei. 7-135318 of the present inventors is utilized. This publication discloses a technique of forming source and drain regions and low-concentration impurity regions in a self-aligned manner by using an oxide film formed by anodization. This technique will be briefly described below.

First, anodization is performed in a 3%-aqueous solution of oxalic acid in a state that the resist mask (not shown) that was used for the patterning of the aluminum film is left, whereby porous anodic oxide films 330–337 are formed. Since low-concentration impurity regions will be formed at a length that is equal to the thickness of the porous anodic oxide films 330–337, the thickness is controlled in consideration of a desired length of low-concentration impurity regions.

After the resist mask (not shown) is removed, anodization is performed in an electrolyte obtained by mixing tartaric acid at 3% with an ethylene glycol solution. As a result, dense, non-porous anodic oxide films 338–341 are formed. The thickness may be set to 70–120 nm.

Figure 5C:
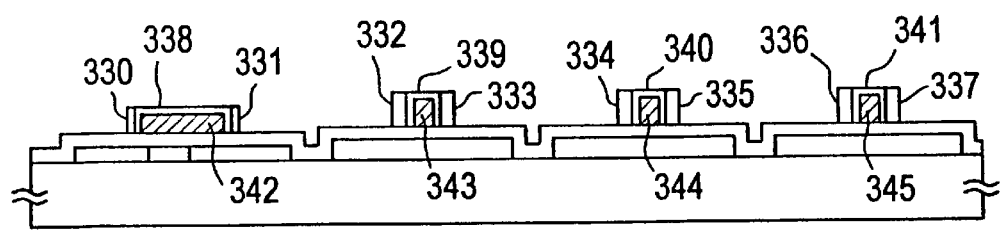

Aluminum films 342–345 that remain after the two anodization steps will substantially function as gate electrodes (see FIG. 5C). The aluminum film 342 will become a floating gate electrode of a memory element.

Figure 5D:
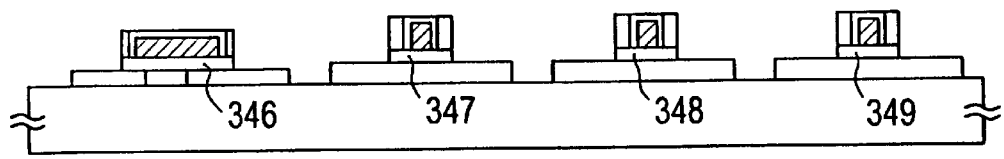

Then, the gate insulating film 325 is etched by dry etching by using the gate electrodes 342–345 and the porous anodic oxide films 330–337 as masks, whereby the gate insulating film 325 is patterned into gate insulating films 346–349 (see FIG. 5D).

Figure 6A:
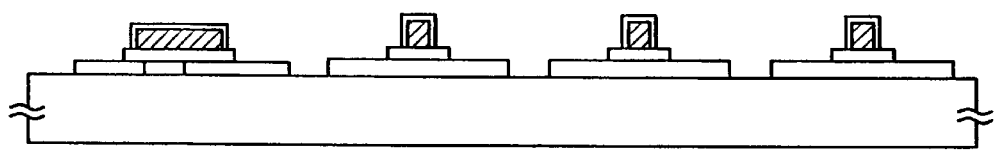

Then, the porous anodic oxide films 330–337 are removed (see FIG. 6A). The end portions of the thus-formed gate insulating films 346–349 project by a length that is equal to the thickness of the porous anodic oxide films 330–337.

Figure 6B:
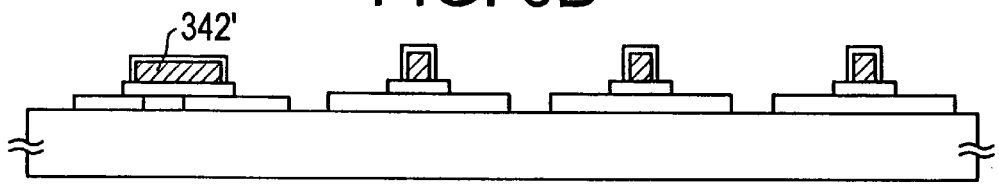
Figure 6C:
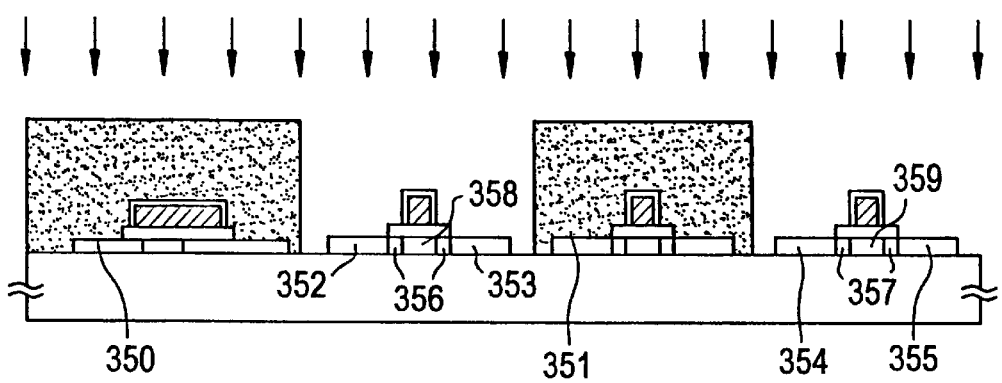

Thereafter, the gate electrode 342 is divided and a floating gate electrode 342' is formed (see FIG. 6B).

Then, a step of adding an impurity element for imparting one conductivity type is executed. The impurity element may be P (phosphorus) or As (arsenic) for an N type and B (boron) or In (indium) for a p type.

First, to add an impurity for an n-type TFT, resist masks 350 and 351 are formed. In this embodiment, the impurity is added in two steps. The first impurity addition step (in this embodiment, P (phosphorus) is used) is executed with a high acceleration voltage of about 80 kV, whereby n⁻ regions 356, 357 are formed. Adjustments are so made that the n⁻ regions have a P concentration of $1 \times 10^{17}$ to $1 \times 10^{19}$ atoms/$cm^3$.

Subsequently, the second impurity addition step is performed with a low acceleration voltage of about 10 kV, whereby n⁺ regions 352–355 are formed. In this step, because of the low acceleration voltage, the gate insulating films 347 and 349 function as masks. Adjustments are so made that the n⁺ regions 352–355 have a sheet resistance of 500Ω or less (preferably 300Ω or less).

As a result, source and drain regions 352–355, low-concentration impurity regions 356 and 357, and channel regions 358 and 359 of n-type TFTs are formed.

Then, after the n-type TFTs are covered with resist masks 360 and 361, impurity ions for imparting p-type conductivity (in this embodiment, B (boron) ions) are added, whereby p⁻ region 364 and p⁺ regions 362, 363 are formed. Adjustments are so made that the p⁻ region 364 have a B concentration of $1 \times 10^{17}$ atoms/$cm^3$ or more (preferably $1 \times 10^{18}$ atoms/$cm^3$ or more). Other than B, Ga, In, or the like may be used.

Figure 6D:
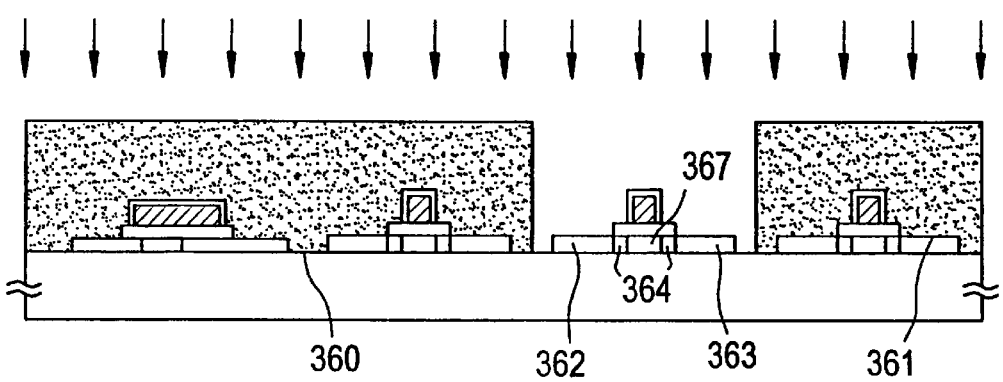

As a result, source and drain regions 362 and 363, low-concentration impurity regions 364, and a channel forming region 367 of a p-type TFT are formed (see FIG. 6D).

Since the low-concentration impurity regions are formed in the switching TFT and the TFTs for a peripheral circuit as described above, impact ionization is hard to occur even though the semiconductor active layers are thin.

After the active layers have been completed in the above manner, the impurity elements are activated by a combination of furnace annealing, laser annealing, lamp annealing, etc. Damage of the active layers that was caused in the impurity addition steps is repaired at the same time.

Having a small number of unmatched bonds, the channel forming regions of the TFTs according to this embodiment can substantially be regarded as single crystals.

Then, a 500-nm-thick interlayer insulating film 368 is formed. The interlayer insulating film 368 may be a silicon oxide film, a silicon nitride film, a silicon oxynitride film, an organic resin film, or a laminated film thereof.

Figure 7A:
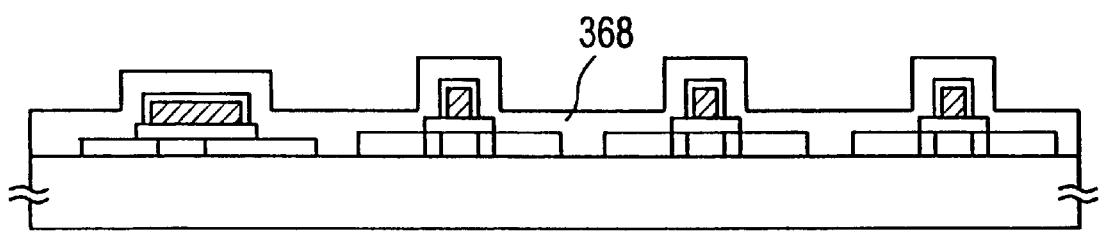
Figure 7B:
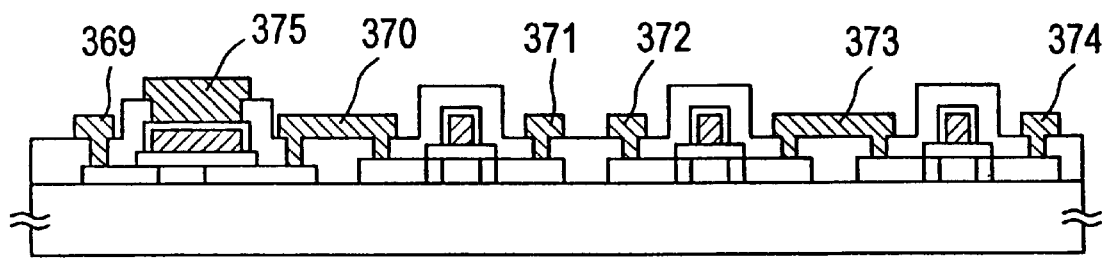

Subsequently, after contact holes are formed, source and drain electrodes 369–374 and a control gate electrode 375 of the memory element is formed so as to be connected to the top surface of the anodic oxide film 338 (see FIG. 7B).

Finally, the entire device is subjected to hydrogenation by heating the entire substrate at 350° C. for 1–2 hours in a hydrogen atmosphere, whereby dangling bonds in the films are terminated. As a result of the above steps, TFTs having structures of FIG. 7B are manufactured.

Knowledge Relating to Impurities Contained in Active Layers

Active layers (semiconductor thin films) formed according to this embodiment has a feature that C (carbon), N (nitrogen), and O (oxygen), which are crystallization-obstructing impurities, do not exist at all or substantially no such elements exist there. This is attained by thorough management of impurities (contaminants).

In this embodiment, because the introduction of C, N, and O is avoided in a thoroughgoing manner in forming amorphous silicon films, the concentrations of C and N finally remaining in semiconductor films are necessarily reduced to at most less than $5\times10^{18}$ atoms/cm$^3$ (typically $5\times10^{17}$ atoms/cm$^3$ or less, preferably $2\times10^{17}$ atoms/cm$^3$ or less) and the concentration of O is necessarily reduced to at most less than $1.5\times10^{19}$ atoms/cm$^3$ (typically $1\times10^{18}$ atoms/cm$^3$ or less, preferably $5\times10^{17}$ atoms/cm$^3$ or less).

Since a semiconductor film of pure silicon has a silicon concentration of about $5\times10^{22}$ atoms/cm$^3$, an impurity element concentration of, say, $5\times10^{18}$ atoms/cm$^3$ corresponds to about 0.01 atomic %.

To obtain superior crystallinity, it is desirable that the concentrations of C, N, and O in a final semiconductor film be less than the lower detection limit of the SIMS analysis, and it is more desirable to completely eliminate those impurity elements.

SIMS analyses conducted by the inventors have revealed that if an amorphous silicon film in which the C, N, and O concentrations are within the above ranges is used as a starting film, the C, N, and O concentrations of an active layer of a completed TFT also fall within the above ranges.

Figure 8A:
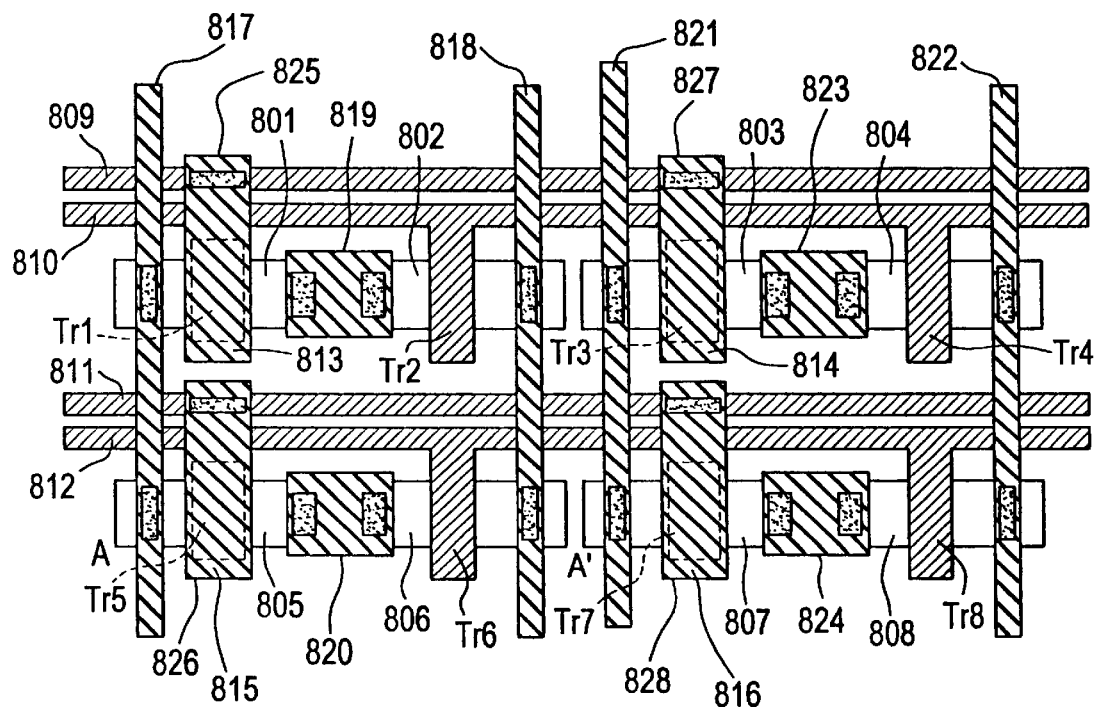
FIGS. 8A–8C are a top view, a sectional view, and a circuit diagram of memory elements and switching elements constituting the nonvolatile memory according to the first embodiment.
Figure 8B:
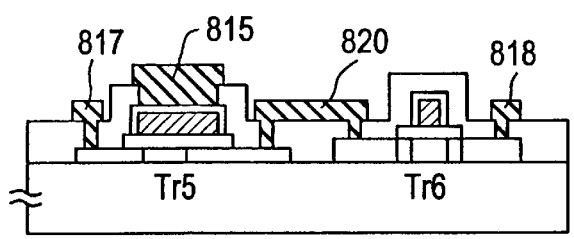
Figure 8C:
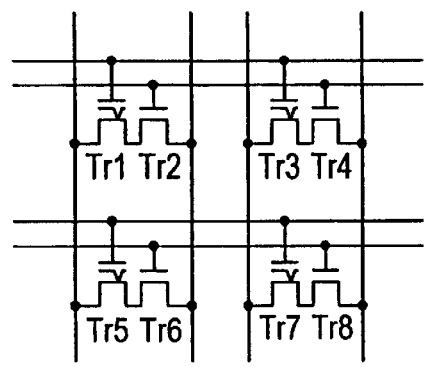

FIG. 8A is a circuit arrangement diagram of the nonvolatile memory according to this embodiment. FIG. 8B is a sectional view taken along line A—A' in FIG. 8A and FIG. 8C is an equivalent circuit diagram of FIG. 8A.

In FIG. 8A, reference numerals 801–808 denote semiconductor active layers of TFTs Tr1–Tr8. First wiring layer lines 809–812 are used as gate electrodes and gate signal lines of Tr2, Tr4, Tr6, and Tr8 and gate signal lines of Tr1, Tr3, Tr5, and Tr7. Floating gate electrodes 813–816 of Tr1, Tr3, Tr5, and Tr7 are formed at the same time as the first wiring layers 809–812 and rendered in a floating state after patterning. Second wiring layer lines 817–828 are used as signal lines connected to source and drain regions of the respective TFTs Tr1–Tr8 and control gate electrodes of Tr1, Tr3, Tr5, and Tr7. In FIG. 8A, solid portions indicate contacts to underlying lines or semiconductor layers. Further, in FIG. 8A, the lines hatched in the same pattern belong to the same wiring layer.

In the nonvolatile memory according to this embodiment, since the semiconductor active layers of the memory elements are made thinner than those of the switching elements and elements constituting peripheral circuits, impact ionization more easily occurs in the memory elements and hence writing and erasure on the memory elements can be performed at low voltages. This reduces the rate of deterioration of the memory elements with respect to the number of write/erase operations. This is an innovative solution to a problem that the gate insulating film of a conventional EEPROM using bulk silicon is prone to deteriorate because it is relatively thin, as well as a solution to a problem that in a conventional EEPROM using bulk silicon, because of a thin gate insulating film, carriers once accumulated in the floating gate flow out due to a temperature increase.

Embodiment 2

According to this embodiment, first, an inexpensive, low-grade quartz substrate is prepared. Then, the quartz substrate is polished into an ideal state (average height difference of asperities: within 5 nm, typically within 3 nm, preferably within 2 nm) by CMP (chemical mechanical polishing) or the like.

In this manner, by subjecting it to polishing, even an inexpensive quartz substrate can be used as an insulative substrate that is superior in flatness. Since a quartz substrate provides a very dense underlying member, the interface between the underlying member and a semiconductor thin film is made highly stable. With an additional advantage that there is almost no contaminative influence from the substrate, this embodiment is very useful.

Embodiment 3

In the first embodiment, a halogen element is used in the step of gettering the catalyst element for accelerating crystallization of silicon. In the invention, the element of phosphorus can also be used in the catalyst element gettering step (this embodiment). The other steps are the same as in the first embodiment.

Where the element of phosphorus is used, phosphorus may be added to regions other than regions to become active layers and a heat treatment may be performed at 400°–1,050° C. (preferably 600°–750° C.) for 1 minute to 20 hours (typically 30 minutes to 3 hours). As a result of the heat treatment, the catalyst element is gettered in the regions where phosphorus is added, whereby the concentration of the catalyst element in the regions to become active layers is reduced to $5\times10^{17}$ atoms/cm$^3$ or less.

After the completion of the gettering step, active layers are formed by using the regions other than the regions where phosphorus is added. Thereafter, the same steps as in the first embodiment are executed. As a result, a semiconductor device having the same features as in the first embodiment is obtained.

Naturally, a heat treatment may also be performed in an atmosphere containing a halogen element in forming a thermal oxidation film to become a gate insulating film. In this case, a multiplier effect of the gettering effect of the element of phosphorus and that of the halogen element can be obtained.

Embodiment 4

This embodiment is directed to a case of constructing an EEPROM by using inverted staggered structure TFTs. This embodiment will be described with reference to FIGS. 9A–9D to 11A–11B. Although in FIGS. 9A–9D to 11A–11B attention is paid to only one memory cell (a memory element and a switching element), address decoders, peripheral circuits, and the like are also formed simultaneously. Actually, as described in the first embodiment in connection with FIG. 1, an EEPROM is constructed by a plurality of memory cells in matrix form, address decoders, and peripheral circuits.

Figure 9A:
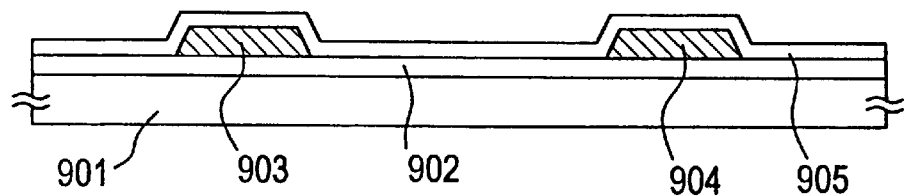

First, as shown in FIG. 9A, a silicon oxide film as an undercoat film 902 is formed on a glass substrate 901 and gate electrodes 903 and 904 are formed thereon. The gate electrode 903 will become a control gate electrode of a memory element and the gate electrode 904 will become a gate electrode of a switching element. Although this embodiment employs chromium films of 200–400 nm in thickness as the gate electrodes 903 and 904, they may be made of an aluminum alloy, tantalum, tungsten, molybdenum, or the like, or may be a conductive silicon film or the like.

Then, a gate insulating film 905 of 100–200 nm in thickness is formed so as to cover the gate electrodes 903 and 904. The gate insulating film 905 may be a silicon oxide film, a silicon nitride film, or a laminated film of a silicon oxide film and a silicon nitride film. Alternatively, anodic oxide films obtained by anodizing the gate electrodes 903 and 904 may be used as gate insulating films.

The portion of the gate insulating film 905 on the side of the memory element will define the capacitance between a floating gate electrode and a control gate electrode that will be formed in the next step. Therefore, the voltage to be applied to the floating gate electrode can be adjusted by changing the thickness of the memory-element-side portion of the gate insulating film 905. Therefore, the thickness of the gate insulating film 905 is not limited to the above range and may be changed partially.

Figure 9B:
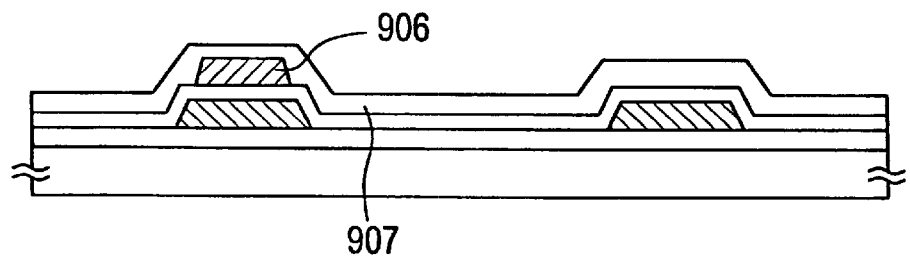

Then, a floating gate electrode 906 is formed (see FIG. 9B). Although this embodiment employs a chromium film as the floating gate electrode 906, it may be made of an aluminum alloy, tantalum, tungsten, molybdenum, or the like, or may be a conductive silicon film or the like.

Then, an insulating film 907 is formed at a thickness of 10–50 nm. The insulating film 907 may be a silicon oxide film, a silicon nitride film, or a laminated film of a silicon oxide film and a silicon nitride film.

Figure 9C:
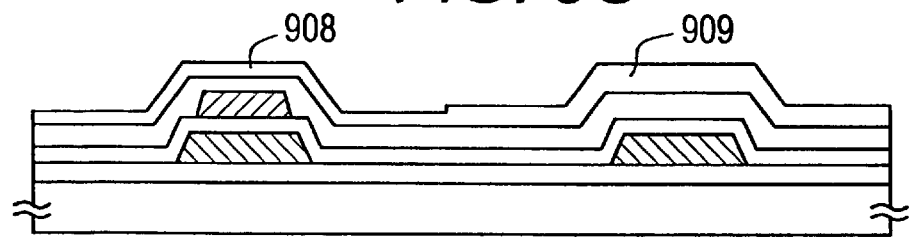

Thereafter, amorphous silicon films 908 and 909 are formed by the method described in the first embodiment in connection with FIGS. 3A–3D (see FIG. 9C). Although in this embodiment the final thicknesses of the amorphous silicon film 908 for the memory element and the amorphous silicon film 909 for the switching element are set to 50 nm and 75 nm, respectively, in the invention they are not limited to those values. The thicknesses of the amorphous silicon films 908 and 909 may be set in ranges of 1–50 nm (preferably 10–40 nm) and 40–100 nm, respectively. Although not shown in FIG. 9C, the thickness of an amorphous silicon film of a TFT for address decoders and peripheral circuits is set the same as that for the switching element.

Figure 9D:
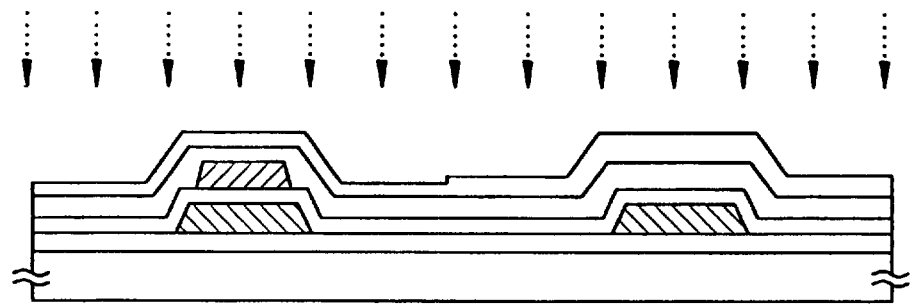

Then, the amorphous silicon films 908 and 909 are crystallized by illuminating those with laser light or strong light that is as intense as laser light (see FIG. 9D). It is preferable to use examiner laser light as laser light. An examiner laser may be a pulsed laser having KrF, ArF, or XeCl as a light source.

Strong light that is as intense as laser light may be one emitted from a halogen lamp, a metal halide lamp, or infrared or ultraviolet lamp.

In this embodiment, the entire amorphous silicon films 908 and 909 are crystallized by scanning the substrate from one end to the other with excimer laser light that is shaped like a linear beam. At this time, the sweep speed of laser light is set to 1.2 mm/s, the processing temperature is set to room temperature, the pulse frequency is set to 30 Hz, and the laser energy density is set to 300–315 mJ/cm$^2$. Crystalline silicon films are obtained by this step.

In this embodiment, the amorphous silicon films 908 and 909 can also be crystallized by the crystallization method employed in the first or third embodiment. Conversely, it is understood that the crystallization method of this embodiment can be applied to the amorphous silicon films of the first embodiment.

Figure 10A:
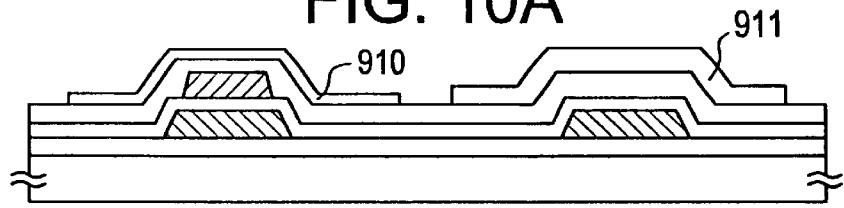

Then, as shown in FIG. 10A, the crystalline silicon films are patterned into active layers 910 and 911.

Then, an impurity element for imparting one conductivity type is added. First, after the active layer portions to constitute channel regions of the memory element, n-type TFTS, and p-type TFTs are covered with resist masks (not shown), an impurity element for imparting p-type conductivity (boron is used in this embodiment; indium or the like may also be used) is added, whereby p$^-$ regions (low-concentration impurity regions; not shown) having a boron concentration of $1 \times 10^{17}$ atoms/cm$^3$ or more (preferably $1 \times 10^{18}$ atoms/cm$^3$ or more) are formed.

Figure 10B:
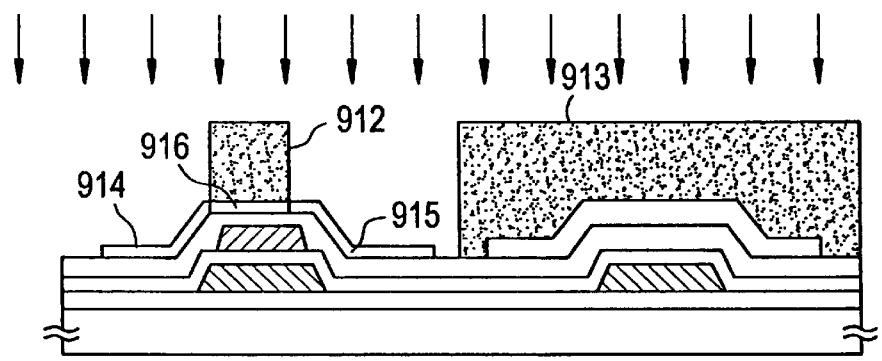

Then, after resist masks 912 and 913 are formed (see FIG. 10B), an impurity element for imparting p-type conductivity is added so as to provide a concentration of about $1 \times 10^{18}$ to $1 \times 10^{20}$ atoms/cm$^3$, whereby a source region 914 and a drain region 915 of the p-type TFT are formed. The portion of the active layer 910 that is covered with the resist mask 912 becomes a channel region (see FIG. 10B).

Figure 10C:
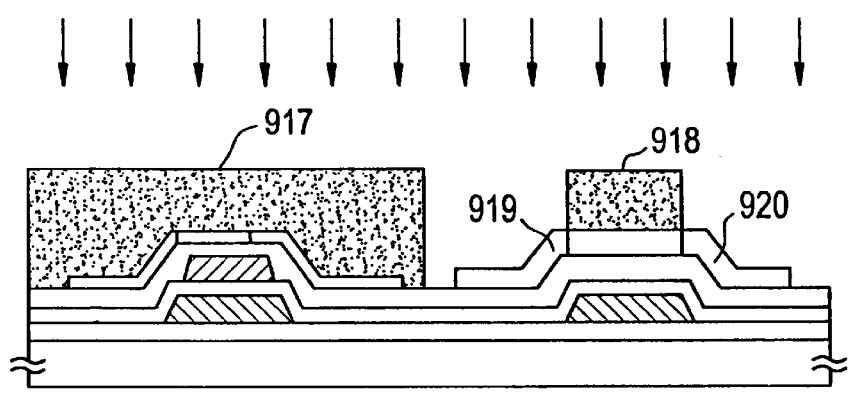

Then, after the resist masks 912 and 913 are removed, resist masks 917 and 918 are formed. Subsequently, an impurity for imparting n-type conductivity (in this embodiment, phosphorus; arsenic or the like may also be used) is added to form low-concentration impurity regions 919 and 920 of about $1 \times 10^{17}$ to $5 \times 10^{18}$ atoms/cm$^3$ (see FIG. 10C).

Figure 10D:
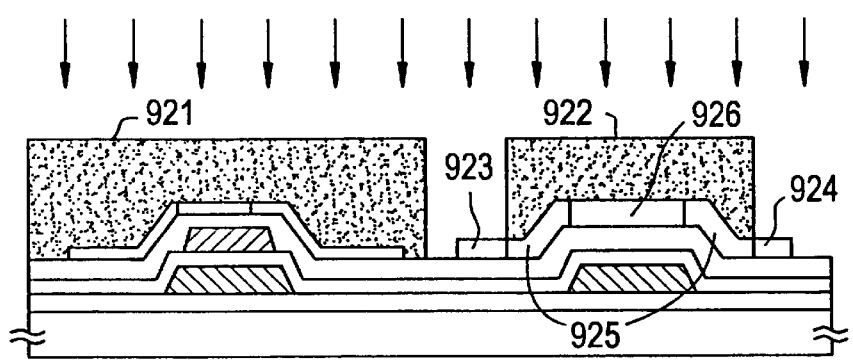

Then, after the resist masks 917 and 918 are removed, resist masks 921 and 922 are formed. Subsequently, an impurity for imparting n-type conductivity is again added at a higher concentration ($1 \times 10^{18}$ to $1 \times 10^{20}$ atoms/cm$^3$) than in the step of FIG. 10C, to form source and drain regions 923 and 924 of the n-type TFT. Reference numerals 925 and 926 denote low-concentration impurity regions and a channel forming region, respectively (see FIG. 10D).

Figure 11A:
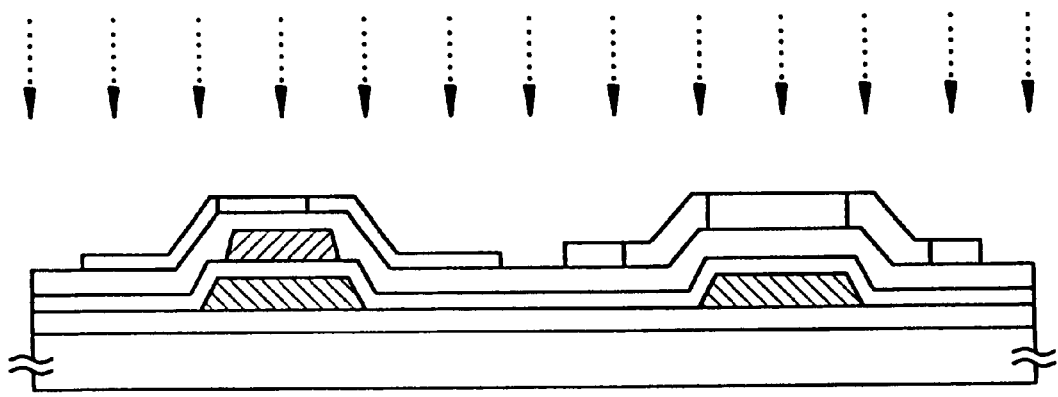

Then, after the resist masks 921 and 922 are removed, excimer laser light is applied (laser annealing) to repair damage that was caused in the ion implanting operations and to activate the added impurities (see FIG. 11A).

Figure 11B:
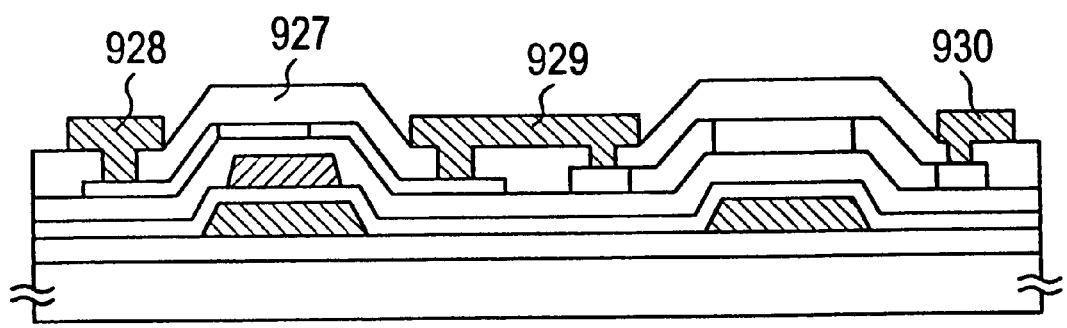

After the completion of the laser annealing, an interlayer insulating film 927 is formed at a thickness of 300–500 nm (see FIG. 11B). The interlayer insulating film 927 may be a silicon oxide film, a silicon nitride film, an organic resin film, or a laminated film thereof.

Then, after contact holes are formed through the interlayer insulating film 927, metal thin films as source and drain electrodes 928–930 are formed (see FIG. 11B). The metal thin films may be made of aluminum, tantalum, titanium, tungsten, or molybdenum, or may be laminated films thereof.

Then, a heat treatment is performed on the entire substrate at 350° C. for about 2 hours in an hydrogen atmosphere, whereby dangling bonds in the films (particularly the channel forming regions) are terminated by hydrogen. As a result of the above steps, the state of FIG. 11B is obtained.

Embodiment 5

The nonvolatile memories according to the first to fourth embodiments have various applications. This embodiment is directed to semiconductor devices in which those nonvolatile memories may be used.

Semiconductor devices in which those nonvolatile memories may be used are a video camera, a still camera, a head-mounted display, a car navigation apparatus, a personal computer, portable information terminals (a mobile computer, a cellular telephone, etc.), and the like. FIGS. 12A–12D show examples of those semiconductor devices.

Figure 12A:
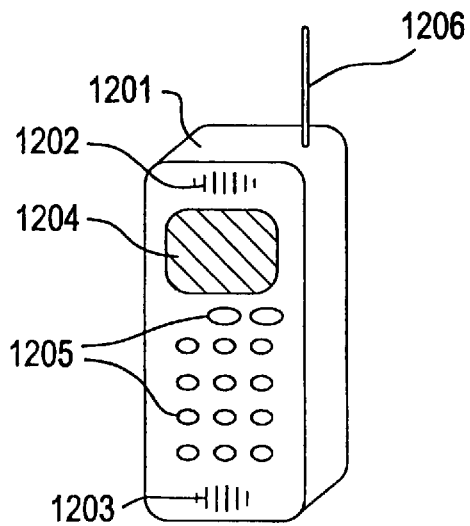
FIGS. 12A–12D show examples of display devices according to a fifth embodiment of the invention to which a nonvolatile memory of the invention is used.

FIG. 12A shows a cellular telephone, which is composed of a main body 1201, a voice output section 1202, a voice input section 1203, a display device 1204, manipulation switches 1205, and an antenna 1206. The nonvolatile memory according to the invention may be formed so as to be integral with the display device 1204.

Figure 12B:
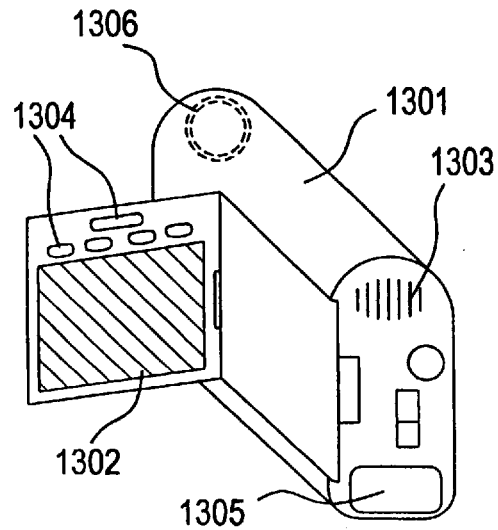

FIG. 12B shows a video camera, which is composed of a main body 1301, a display device 1302, a sound input section 1303, manipulation switches 1304, a battery 1305, and an image receiving section 1306. The nonvolatile memory according to the invention may be formed so as to be integral with the display device 1302.

Figure 12C:
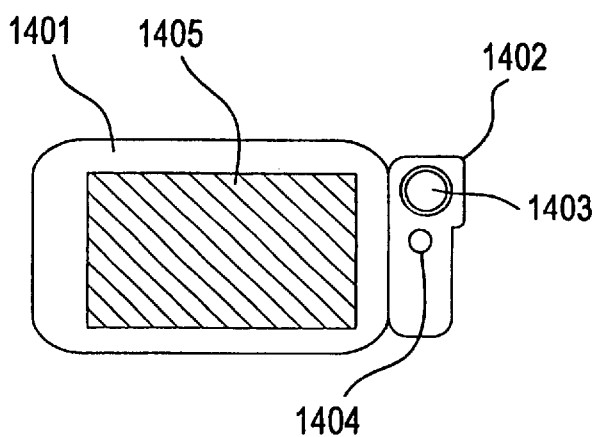

FIG. 12C shows a mobile computer, which is composed of a main body 1401, a camera section 1402, an image receiving section 1403, a manipulation switch 1404, and a display device 1405. The nonvolatile memory according to the invention may be formed so as to be integral with the display device 1405.

Figure 12D:
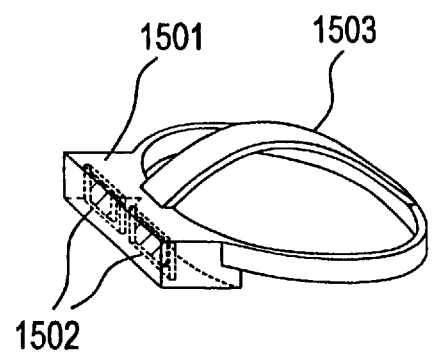

FIG. 12D shows a head-mounted display, which is composed of a main body 1502, display devices 1502, and a band section 1503. The nonvolatile memory according to the invention may be formed so as to be integral with the display devices 1502.

Embodiment 6

This embodiment is directed to a case of forming gate electrodes by using Ta (tantalum) or a Ta alloy in any of the manufacturing methods described in the first to fourth embodiments.

A gate electrode made of Ta or a Ta alloy can be subjected to thermal oxidation at about 450° –600° C., whereby an oxide film of $Ta_2O_3$ or the like having superior film quality can be formed thereon. It has become apparent that this oxide film has better film quality than an oxide film that is formed on an Al (aluminum) gate electrode as described in the first embodiment.

This has been found from the fact that in a J-E characteristic (current density vs. electric field strength characteristic) that is one of the withstand voltage evaluation items for insulating film oxide films of Ta or a Ta alloy exhibit better characteristics than Al oxide films.

Having relative dielectric constant of about 11.6, $Ta_2O_3$ can provide large capacitance between a floating gate electrode and a control gate electrode. Therefore, a gate electrode made of Ta or a Ta alloy has another advantage that charge can easily be injected into a floating gate electrode than in the case of using an Al gate electrode.

Further, a gate electrode made of Ta can be anodized as described in the above embodiments.

Knowledge Relating to CGS

This embodiment is directed to a semiconductor thin film formed by the manufacturing method described in the first embodiment. According to the manufacturing method of the first embodiment, a crystal silicon film called continuous grain boundary crystal silicon (i.e., continuous grain silicon: CGS) can be obtained by crystallizing an amorphous silicon film.

A lateral growth region of a semiconductor thin film obtained by the manufacturing method of the first embodiment has a unique crystal structure that is a collected body of rod-like or flat-rod-like crystals. Features of this crystal structure will be described below.

Knowledge Relating to Crystal Structure of Active Layer

A lateral growth region formed according to the manufacturing process of the first embodiment has a crystal structure in which microscopically a plurality of rod-like (or flat-rod-like) crystals are arranged approximately parallel with each other with regularity that is associated with a particular direction. This can easily be confirmed by an observation by a TEM (transmission electron microscope) method.

Figure 13A:
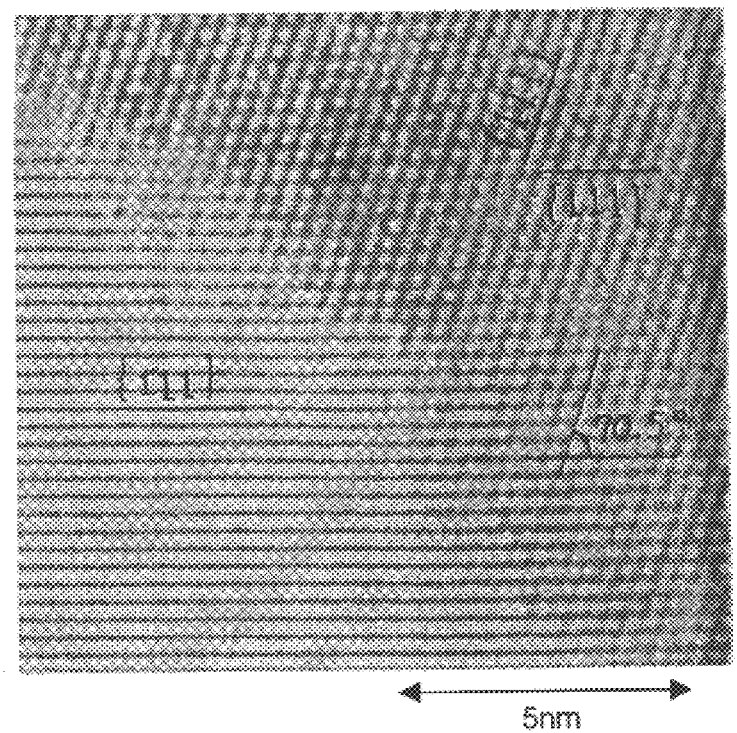
FIGS. 13A and 13B are TEM photographs of crystal grains of semiconductor thin films.

By a HR-TEM (high-resolution transmission electron microscope) method, the inventors observed, in a detailed manner, a grain boundary of a semiconductor thin film formed by the above-described manufacturing method by magnifying it at a magnification factor of eight million (see FIG. 13A). In this specification, the term "grain boundary" is defined as a grain boundary that is formed at an interface between different rod-like crystals, unless otherwise specified. Therefore, it is discriminated from, for instance, a macroscopic grain boundary as formed by collision between different lateral growth regions.

The HR-TEM method is a technique for evaluating an arrangement of atoms or molecules by utilizing interference between transmission electrons or elastic scattering electrons that are produced by applying an electron beam to a sample vertically. This technique allows an arrangement state of crystal lattices to be observed as a lattice fringe. Therefore, a bonding state of atoms at a grain boundary can be inferred by observing the grain boundary.

A TEM photograph (see FIG. 13A) obtained by the inventors clearly shows a state that two different crystal grains (rod-like crystal grains) contact each other at a grain boundary. Although the crystal axes of the two crystal grains have a small variation, it has been confirmed electron beam diffraction that they approximately have a {110} orientation.

Incidentally, in lattice fringe observations by using TEM photographs like the above one, a lattice fringe corresponding to the {111} plane were observed in a lattice fringe of the {110} plane. The term "lattice fringe corresponding to the {111} plane" means a lattice fringe in which a {111} plane appears on a cross-section obtained by cutting a crystal grain along the lattice fringe. A simplified method for checking which plane a lattice fringe corresponds to is to use the distance between lattice fringe stripes The inventors obtained very interesting knowledge through a detailed observation of the TEM photograph of FIG. 13A of the semiconductor thin film formed by the manufacturing method of the first embodiment. Each of the two different crystal grains of the photograph had a lattice fringe corresponding to the {111} plane, and clearly the two lattice fringes ran parallel with each other.

Further, irrespective of the presence of the grain boundary, the lattice fringes of the two crystal grains were connected to each other so as to traverse the grain boundary. That is, it was found that most of lattice fringe stripes that traversed the grain boundary were straight and continuous at the grain boundary though they are of the different crystal grains. This applies to any grain boundary; 90% or more (typically 95% or more) of all lattice fringe stripes were continuous at a grain boundary.

The above type of crystal structure (more correctly, crystal grain structure) indicates that the two different crystal grains are joined to each other with a very high degree of matching at the grain boundary. That is, crystal lattices continuously extend at the grain boundary and trap states due to crystal defects etc. are less prone to occur. In other words, it can be said that crystal lattices have continuity at the grain boundary.

Figure 13B:
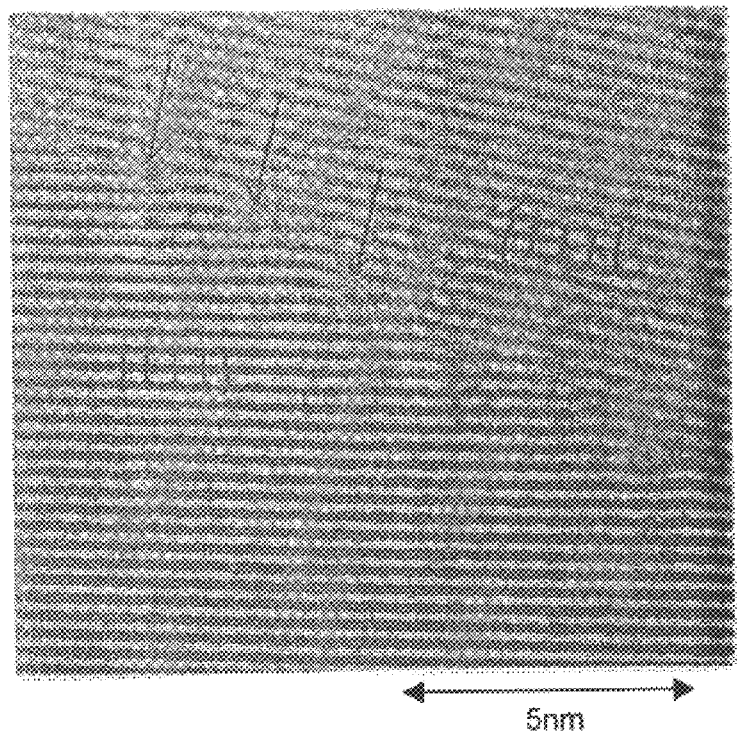

For reference, the inventors performed analyses on a conventional polysilicon film (what is called a high-temperature polysilicon film) by electron beam diffraction and HR-TEM observation (see FIG. 13B). Results were such that lattice fringes of two different crystal grains ran completely independently and there were almost no junctions at the grain boundary where the crystal grains are continuous with each other with a high degree of matching. That is, it was found that there were many portions (part of those are indicated by arrows) at the grain boundary where lattice fringe stripes are terminated as well as many crystal defects.

Dangling bonds exist in those portions and act, at a high probability, as trap states that obstruct movement of carriers.

The inventors call a bonding state of atoms a matched bond for which lattice fringes are well matched as in the case of a semiconductor thin film obtained by the manufacturing method of the first embodiment. On the other hand, a bonding state of atoms for which lattice fringes are not matched well as frequently found in conventional polysilicon films is called an unmatched bond (or dangling bond).

A semiconductor thin film used in the nonvolatile memory of the invention has a very high degree of matching at grain boundaries and hence have very small number of unmatched bonds. The inventors' investigation of arbitrary grain boundaries showed that the ratio of unmatched bonds to all bonds was 10% or less (preferably 5% or less, even preferably 3% or less). That is, 90% or more (preferably 95% or more, even preferably 97% or more) of all bonds are matched bonds.

Figure 14A:
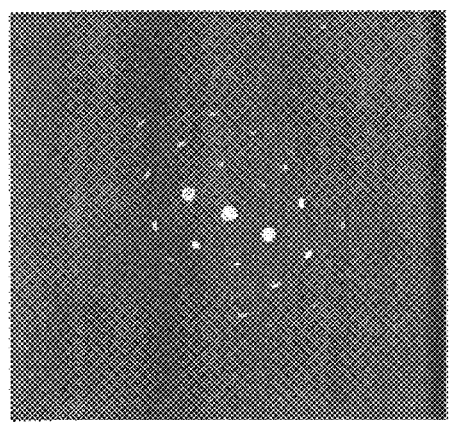
FIGS. 14A–14C are photographs and a schematic diagram of electron diffraction patterns of semiconductor thin films.
Figure 14B:
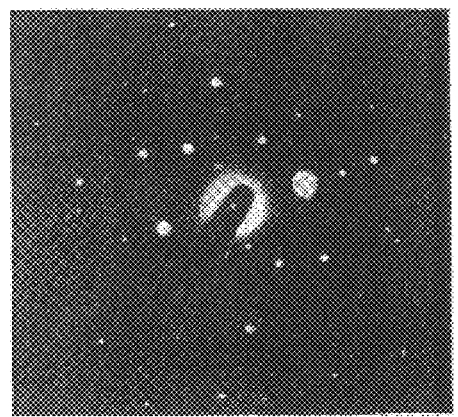

FIG. 14A shows an observation result by electron beam diffraction of a lateral growth region formed by the manufacturing method of the first embodiment. FIG. 14B shows an electron beam diffraction pattern of a conventional polysilicon film (usually called a high-temperature polysilicon film) that was observed for comparison.

Since the photographs of FIGS. 14A and 14B were taken with the diameter of an electron beam irradiation spot at 1.35 $\mu$m, it can be said that they reflect information of a sufficiently macroscopic region as compared with the case of a lattice fringe.

Figure 14C:
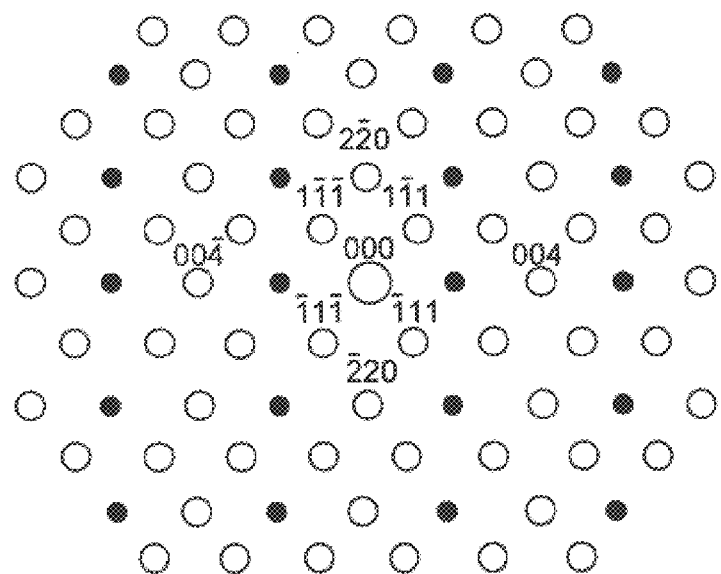

FIG. 14C is a schematic diagram of an electron beam diffraction pattern that will be obtained when an electron beam is applied vertically to the {110} plane of single crystal silicon. Usually, an orientation of an observation sample is estimated by comparing an observation result with such an electron beam diffraction pattern.

In the case of FIG. 14A, diffraction spots corresponding to the <110> incidence shown in FIG. 14C appear relatively clearly and hence it is confirmed that the crystal axis is the <110> axis (the crystal surface is the {110} plane).

Respective spots have slight expanses on concentric circles, which is considered due to a certain distribution of a rotation angle about the crystal axis. From the pattern, the degree of expanse is estimated to be within 5°.

Among a large number of observed patterns, there are patterns that include a portion where no diffraction spot exists (the pattern of FIG. 14A has a portion where no diffraction spot is found). This is considered due to the fact that the sample approximately has the {110} orientation but the crystal axis has a slight deviation.

Based on the fact that crystal surfaces almost always include the {111} plane, the inventors infer that a deviation in the rotation angle about the <111> axis is a cause of the above phenomenon.

On the other hand, in the case of the electron beam diffraction pattern of FIG. 14B, diffraction spots have no clear regularity and hence it is confirmed that crystals are oriented almost randomly. That is, it is inferred that crystals having face orientations other than the {110} orientation are mixed irregularly.

As indicated by the above observation results, in a crystalline silicon film formed by the manufacturing method of the first embodiment, almost all crystal grains approximately have the {110} orientation and crystals have continuity at grain boundaries. Conventional polysilicon films do not have this feature.

As described above, a semiconductor thin film formed by the manufacturing method of the first embodiment has an entirely different crystal structure (more correctly, crystal grain structure) from conventional semiconductor thin films. The inventors described results of analyses on a semiconductor thin film to be used in the invention in Japanese Patent Application Serial Nos. Hei. 9-55633, Hei. 9-165216, and Hei. 9-212428.

The inventors calculated orientation ratios of a crystalline silicon film formed by the above manufacturing method by performing X-ray diffraction according to the method described in Japanese Patent Laid-Open No. Hei. 7-321339. In this publication, orientation ratios are defined by the following calculation formulae:

({220} orientation existence ratio)=1 (constant)

({111} orientation existence ratio)=(sample relative intensity of {111} to {220})/{powder relative intensity of {111} to {220})

({311} orientation existence ratio)=(sample relative intensity of {311} to {220})/{powder relative intensity of {311} to {220})

({220} orientation ratio)=({220} orientation existence ratio)/ [({220} orientation existence ratio)+({111} orientation existence ratio)+({311} orientation existence ratio)]

Figure 17:
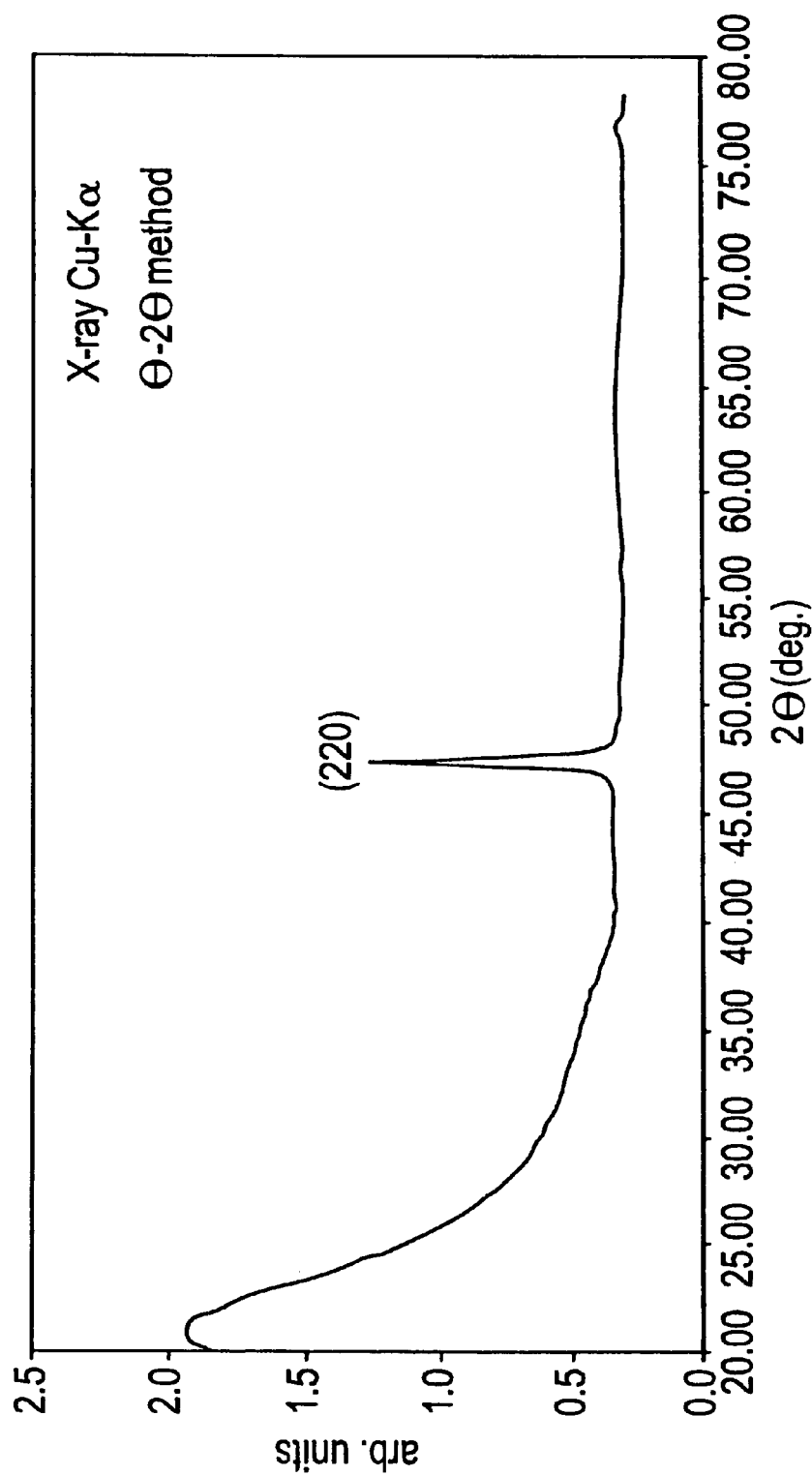
FIG. 17 is a graph showing a result of an X-ray diffraction measurement on a semiconductor thin film.

FIG. 17 shows an example of a result of an X-ray diffraction measurement that was conducted to determine an orientation of a semiconductor thin film formed by the above manufacturing method. The X-ray diffraction pattern has a peak corresponding to the (220) plane which is naturally equivalent to the {110} plane. This measurement result showed that the main orientation was the {110} orientation and the orientation ratio was 0.7 or more (typically 0.9 or more).

As described above, it is understood that the crystalline silicon film formed by the manufacturing method of the first embodiment has an entirely different crystal structure from conventional polysilicon films. Based on this fact, it can be said that the crystalline silicon film of the invention is an entirely new semiconductor film.

In forming a semiconductor thin film according to the first embodiment, the annealing step that is executed at a temperature higher than the crystallization temperature plays an important role for reduction of defects in grain boundaries. This will be described below.

Figure 15A:
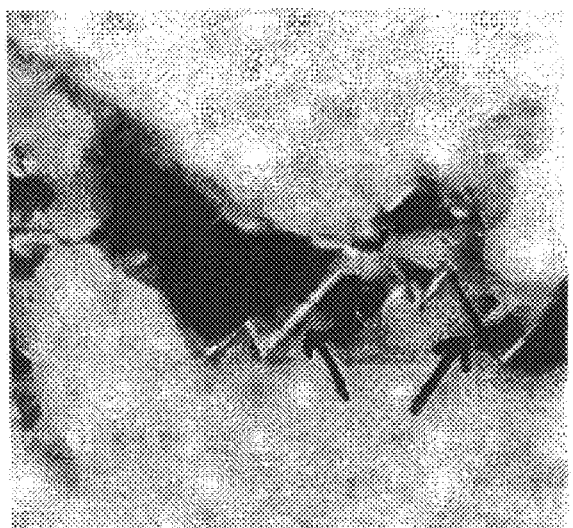
FIGS. 15A and 15B are TEM photographs of crystal grains of semiconductor thin films.

FIG. 15A is a TEM photograph, taken at a magnification factor of 250,000, of a crystal silicon film obtained at the stage that the steps to the crystallization step of the manufacturing method of the first embodiment have been finished. Zigzagged defects indicated by arrows exist in a crystal grain (black and white portions appear due to a difference in contrast).

This type of defects are mainly stacking faults in which the stacking order of atoms in silicon lattice planes are incorrect, and may also be dislocations or the like. The defects shown in FIG. 15A seem to be stacking faults having fault planes that are parallel with the {111} plane. This is inferred from the fact that the zigzagged defects are bent at an angle of about 70°.

Figure 15B:

On the other hand, as seen from a photograph of FIG. 15B that was taken at the same magnification factor, a crystal silicon film formed by the manufacturing method of the first embodiment has no defects such as stacking faults, dislocations, or the like in a crystal grain. It is confirmed that the crystallinity is very high. This tendency holds for the entire film area. Although it is currently difficult to make the number of defects zero, it is possible to reduce the number to a level that can be regarded as substantially zero.

That is, the crystal silicon film shown in FIG. 15B can be regarded or substantially regarded as a single crystal because the number of defects in a crystal grain is reduced to a negligible level and grain boundaries never act as barriers to carrier movement by virtue of their high level of continuity.

As described above, although the crystal silicon films shown in the photographs of FIGS. 15A and 15B have approximately equal levels of continuity at grain boundaries, they are much different in the number of defects in a crystal grain. The fact that the electrical characteristics of the crystal silicon film formed by the manufacturing method of the first embodiment shown in FIG. 15B are much superior to those of the crystal silicon film shown in FIG. 15A is largely due to the difference in the number of defects.

The crystal silicon film (see FIG. 15B) formed by the manufacturing method of the first embodiment has the feature that the number of defects in a crystal drain is much smaller than the crystal silicon film (see FIG. 15A) that has been merely crystallized.

The difference in the number of defects appears as a difference in spin density in an electron spin resonance (ESR) analysis. It has become apparent that at present the crystal silicon film formed by the manufacturing method of the first embodiment has a spin density of at most $5 \times 10^{17}$ spins/cm$^3$ or less (preferably $3 \times 10^{17}$ spins/cm$^3$ or less). However, since this measurement value is close to the detection limit of a currently available measurement instrument, it is inferred that the actual spin density is smaller than the above value.

The inventors call a crystal silicon film having the above crystal structure and features continuous grain boundary crystal silicon (or continuous grain silicon: CGS).

While in conventional semiconductor thin films grain boundaries act as barriers that obstruct movement of carriers, the semiconductor thin film formed by the manufacturing method of the first embodiment realizes high carrier mobility because substantially no such grain boundaries exist. Therefore, a TFT manufactured by using a semiconductor thin film formed by the manufacturing method of the first embodiment exhibit much superior electrical characteristics. This will be described below.

Knowledge Relating to Electrical Characteristics of TFT

A semiconductor thin film formed by the manufacturing method of the first embodiment can substantially be regarded as a single crystal because substantially no grain boundaries exist. Therefore, a TFT using it as an active layer exhibits electrical characteristics that are equivalent to those of a MOSFET using single crystal silicon. The following data have been obtained from TFTs that were experimentally manufactured by the inventors.

(1) The subthreshold coefficient, which is an index of the switching characteristic (quickness of on/off switching) of a TFT, is as small as 60–100 mV/decade (typically 60–85 mV/decade) in each of n-channel and p-channel TFTs.

(2) The field-effect mobility $\mu_{FE}$, which is an index of the operation speed of a TFT, is as large as 200–650 cm$^2$/Vs (typically 250–300 cm/Vs) in an n-channel TFT and as 100–300 cm$^2$/Vs (typically 150–200 cm$^2$/Vs) in a p-channel TFT.

(3) The threshold voltage $V_{th}$, which is an index of the drive voltage of a TFT, is as small as −0.5 to 1.5 V in an n-channel TFT and as −1.5 to 0.5 V in a p-channel TFT.

As described above, it has been confirmed that a TFT that is much superior in both switching characteristic and high-speed operation characteristic can be realized.

From the above discussions, it is understood that the catalyst element gettering step is a step that is indispensable for formation of CGS. The inventors assume the following model for a phenomenon that occurs in this step.

In the state of FIG. 15A, the catalyst element (typically nickel) is segregated at defects (mainly stacking faults) in a crystal grain; that is, there are many Si—Ni—Si bonds.

However, if Ni is removed from defects by executing the catalyst element gettering process, Si—Ni bonds are disconnected. Resulting excess unconnected bonds of Si atoms immediately form new Si—Si bonds. The defects disappear in this manner and the bonding states are rendered stable.

Although naturally it is known that defects in a crystal silicon film disappear when thermal annealing is performed at a high temperature, the model being discussed is different from this phenomenon. The inventors infer that re-combining of Si atoms occurs smoothly due to many unconnected bonds that are produced by disconnection of Si—Ni—Si bonds.

The inventors also assume a model that the heat treatment at a temperature (700°–1,100° C.) higher than the crystallization temperature causes defects to disappear because a crystal silicon film is fixed to the underlying member and the adhesion is increased.

Knowledge Relating to TFF Characteristics and CGS

The above-described superior TFT characteristics is largely due to the use, as a TFT active layer, of a semiconductor thin film in which crystal lattices have continuity at grain boundaries. The reason will be described below.

The continuity of crystal lattices at grain boundaries results from the fact that the grain boundaries are of a type called the "planar boundary." The definition of the term "planar boundary" as used in this specification is the same as that of the "planar boundary" that is described in Ryuichi Shimokawa and Yutaka Hayashi, "Characterization of High-Efficiency Cast-Si Solar Cell Wafers by MBIC Measurement," Japanese Journal of Applied Physics, Vol. 27, No. 5, pp. 751–758, 1988.

According to this paper, the planar boundary includes the {111} twin boundary, the {111} stacking fault, the {221} twin boundary, the {221} twist boundary, etc. The planar boundary has a feature that it is electrically inactive. That is, although the planar boundary is a grain boundary, it does not act as a trap that obstructs movement of carriers. Therefore, the planar boundary can be regarded as substantially absent.

In particular, the {111} twin boundary is called a coincidence grain boundary of Σ3 and the {221} twin boundary is called a coincidence grain boundary of Σ9. The Σ value is a parameter as an index that indicates the degree of matching of a coincidence grain boundary. It is known that a grain boundary having a smaller Σ value is higher in the degree of matching.

The inventors' detailed TEM observation of semiconductor thin films formed by the manufacturing method of the first embodiment has revealed that most of (90% or more, typically 95% or more) of grain boundaries are coincidence grain boundaries of Σ3, that is, {111} twin boundaries.

It is known that a grain boundary formed between two crystal grains is a coincidence grain boundary of Σ3 if both crystal grains have a {110} orientation and θ=70.5° where θ is an angle formed by a lattice fringe corresponding to the {111} plane.

In the grain boundary in the TEM photograph of FIG. 13A, the lattice fringe stripes of the adjacent crystal grains extend continuously to form an angle of about 70°. Therefore, it is easily presumed that this grain boundary is a {111} twin boundary.

If θ=38.9°, the grain boundary is a coincidence grain boundary of Σ9. Like this type of boundary, grain boundaries other than the {111} twin boundary also existed.

These types of coincidence grain boundaries are formed only between crystal grains having the same face orientation. That is, this type of coincidence grain boundaries can be formed over a wide area in a semiconductor thin film formed by the manufacturing method of the first embodiment because face orientations are approximately the same ({110} orientation). Polysilicon films having irregular face orientations never have such a feature.

Figure 16A:
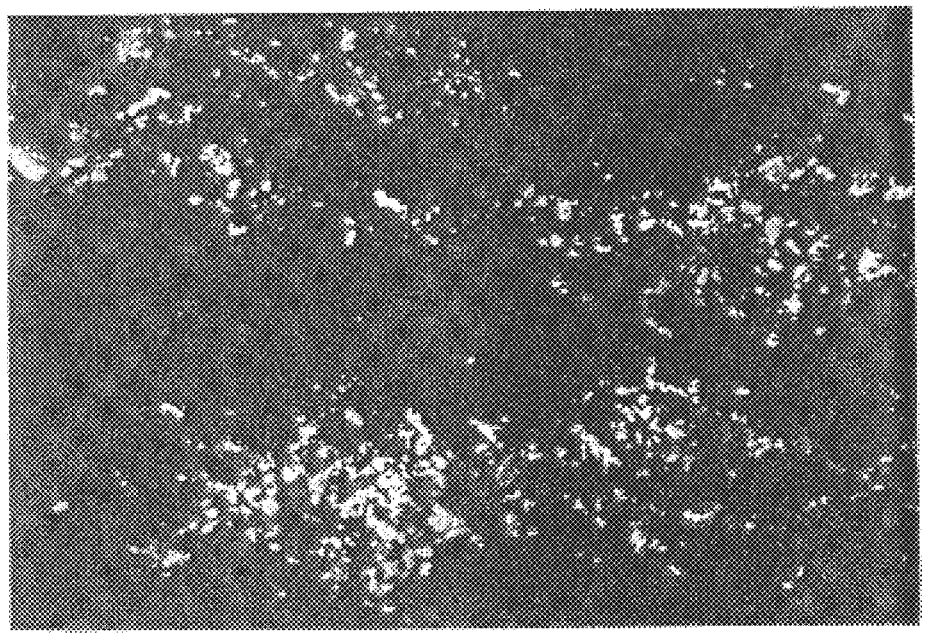
FIGS. 16A and 16B are TEM photographs showing dark field images of semiconductor thin films.

FIG. 16A is a TEM photograph (dark field image), taken at a magnification factor of 15,000, of a semiconductor thin film formed by the manufacturing method of the first embodiment. There are regions that look white and regions that look black. The regions of the same color have the same orientation.

A feature in FIG. 16A that deserves special mention is that the white portions collectively exist. This means that crystal grains having the same orientation exist with a certain degree of directivity and adjacent crystal grains have almost the same orientations.

Figure 16B:

On the other hand, FIG. 16B is a TEM photograph (dark field image), taken at a magnification factor of 15,000, of a conventional high-temperature polysilicon film. In this high-temperature polysilicon film, portions having the same face orientation are dispersed randomly; no collective structure having directivity like the one shown in FIG. 16A is found. This is considered due to the fact that adjacent crystal grains are oriented entirely irregularly.

The inventors repeated observations and measurements on the semiconductor thin film of FIG. 13A at many regions other than the measurement point of FIG. 13A, and have confirmed that the continuity of crystal lattices is secured in grain boundaries over a sufficiently large area to manufacture a TFT.

Figure 18:
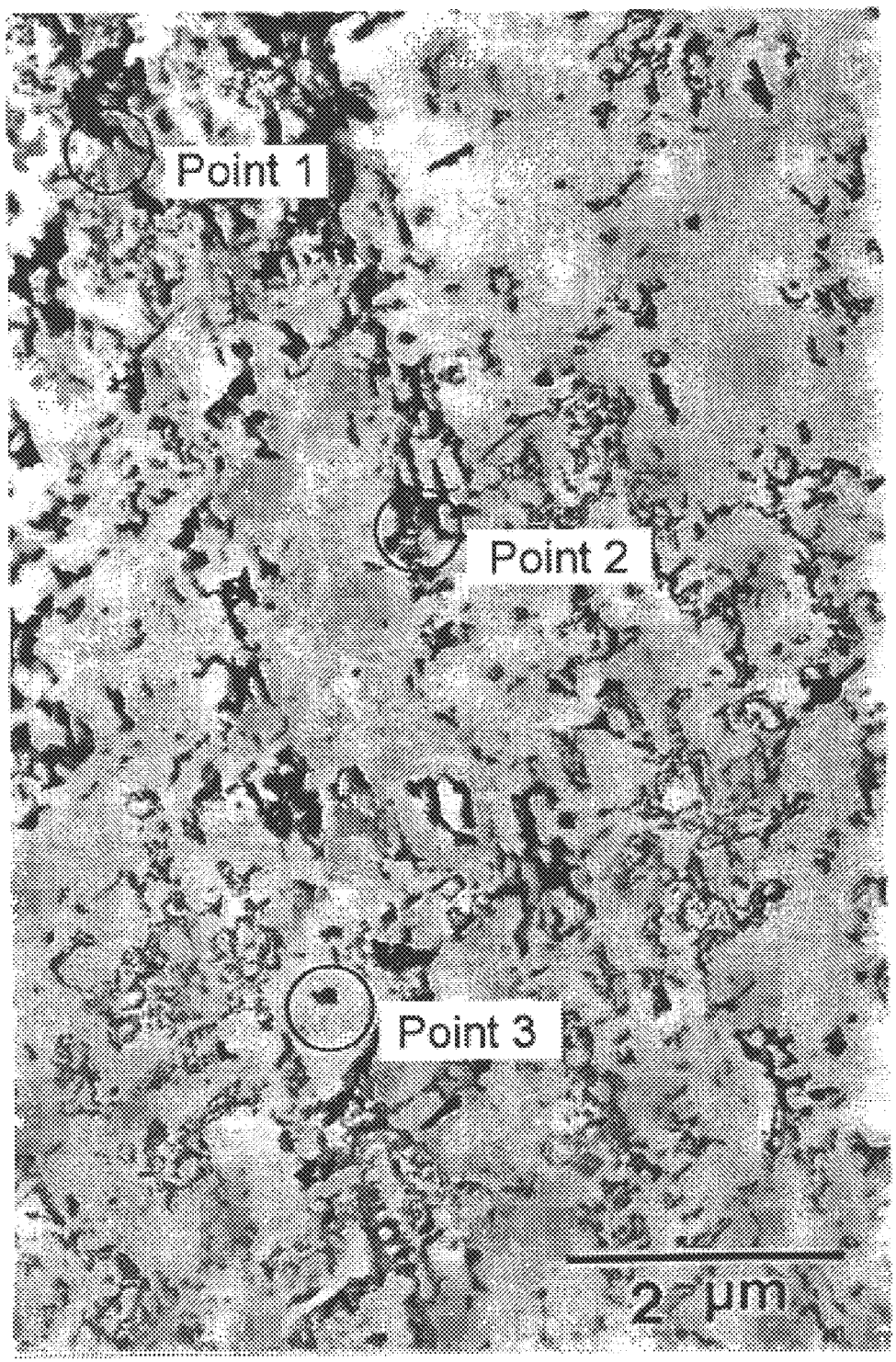
FIG. 18 is a TEM photograph showing a dark field image of a semiconductor thin film.
Figure 19A:
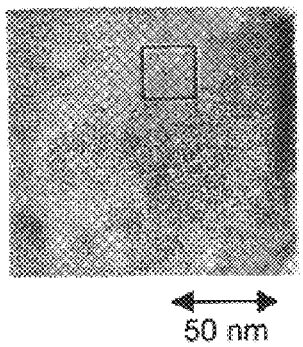
FIGS. 19A–19C are TEM photographs and an electron beam diffraction pattern of a grain boundary of a semiconductor thin film.
Figure 19B:
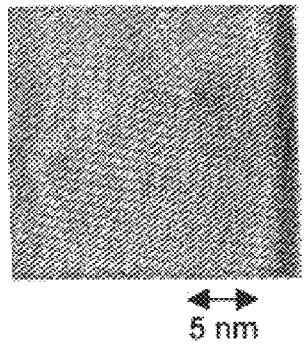
Figure 19C:
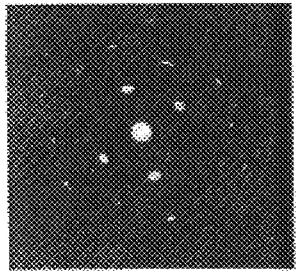

FIG. 18 is a TEM photograph of a light field image of a semiconductor film formed according to the manufacturing method of the third embodiment in which phosphorus is used in the nickel gettering step. FIGS. 19A and 19B are photographs of point 1 indicated in FIG. 18 at magnification factors of three hundred thousand and two million, respectively. The region that is enclosed by a square in FIG. 19A corresponds to FIG. 19B. FIG. 19C is an electron beam diffraction pattern (spot diameter: 1.7 µm) obtained at point 1.

Figure 20A:
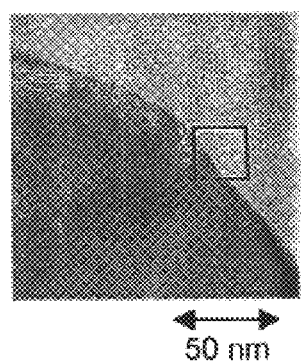
FIGS. 20A–20C are TEM photographs and an electron beam diffraction pattern of another grain boundary of the semiconductor thin film.
Figure 20B:
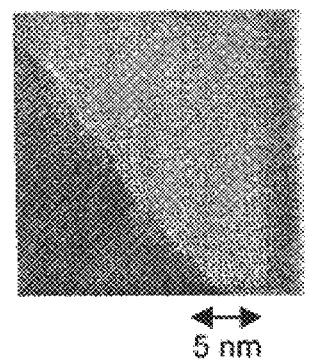
Figure 20C:
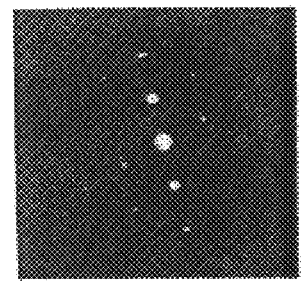
Figure 21A:
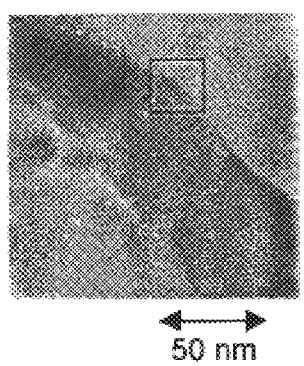
FIGS. 21A–21C are TEM photographs and an electron beam diffraction pattern of still another grain boundary of the semiconductor thin film.
Figure 21B:
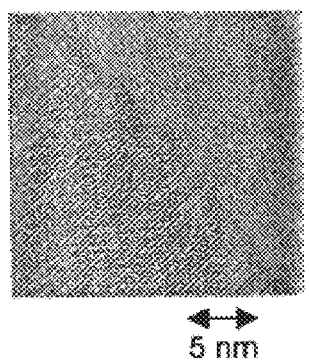
Figure 21C:
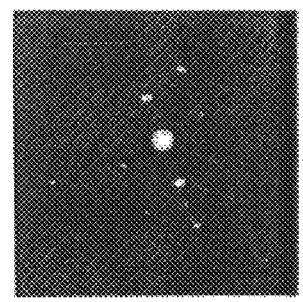

Point 2 and point 3 were also observed under exactly the same conditions as point 1. FIGS. 20A–20C show observation results of point 2 and FIGS. 21A–21C show observation results of point 3.

It is seen from the above observation results that the continuity of crystal lattices is secured and a planar boundary is formed at any grain boundary. The inventors repeated observations and measurements on the above semiconductor thin film at many regions other than the above measurement points, and have confirmed that the continuity of crystal lattices is secured in grain boundaries over a sufficiently large area to manufacture a TFT.

According to the invention, a nonvolatile memory can be formed on the same substrate so as to be integral with its peripheral circuits such as a driver circuit and hence miniaturization is attained.

According to the invention, semiconductor active layers of a nonvolatile memory are relatively thin. Therefore, a nonvolatile memory in which impact ionization easily occurs and which can be driven at a low voltage and is less prone to deteriorate can be realized.

Further, since a nonvolatile memory according to the invention can be formed so as to be integral with parts of a semiconductor device, the semiconductor device can be miniaturized.

What is claimed is:

1. A semiconductor device having at least one nonvolatile memory, said nonvolatile memory comprising:
   a plurality of memory cells arranged in a matrix form, each of said memory cells including a memory element and a switching element;
   said memory element comprising:
      a first semiconductor layer formed over a substrate;
      a first gate insulating film formed over said first semiconductor layer;
      a floating gate electrode formed over said first gate insulating film;
      an insulating film formed over said floating gate electrode; and
      a control gate electrode formed over said insulating film,
   said switching element comprising:
      a second semiconductor layer formed over said substrate;
      a second gate insulating film formed over said second semiconductor layer; and
      a gate electrode formed over said second gate insulating film,
   wherein a thickness of said first semiconductor layer is smaller than that of said second semiconductor layer.

2. A semiconductor device according to claim 1, wherein said first semiconductor layer and said second semiconductor layer have thicknesses of 1–50 nm and 40–100 nm, respectively.

3. A semiconductor device according to claim 1, wherein said first semiconductor layer has a thickness of 10–40 nm.

4. A semiconductor device according to claim 1, wherein said first semiconductor layer has a thickness so that impact ionization occurs more easily than said second semiconductor layer.

5. A semiconductor device according to claim 1, said semiconductor device is selected from the group consisting of a video camera, a still camera, a head-mounted display, a car navigation apparatus, a personal computer, a portable information terminal, a mobile computer and a cellular telephone.

6. A semiconductor device having at least one nonvolatile memory, said nonvolatile memory comprising:
   a plurality of memory cells arranged in a matrix form, each of said memory cells including a memory element and a switching element;
   said memory element comprising:
      a first semiconductor layer formed over a substrate;
      a first gate insulating film formed over said first semiconductor layer;
      a floating gate electrode formed over said first gate insulating film;
      an insulating film formed over said floating gate electrode; and
      a control gate electrode formed over said insulating film,
   said switching element comprising:
      a second semiconductor layer formed over said substrate;
      a second gate insulating film formed over said second semiconductor layer; and
      a gate electrode formed over said second gate insulating film,
   wherein a thickness of said first semiconductor layer is smaller than that of said second semiconductor layer,
   wherein said first and second semiconductor layers comprise crystalline silicon.

7. A semiconductor device according to claim 6, wherein said first semiconductor layer and said second semiconductor layer have thicknesses of 1–50 nm and 40–100 nm, respectively.

8. A semiconductor device according to claim 6, wherein said first semiconductor layer has a thickness of 10–40 nm.

9. A semiconductor device according to claim 6, wherein said first semiconductor layer has a thickness so that impact ionization occurs more easily than said second semiconductor layer.

10. A semiconductor device according to claim 6, said semiconductor device is selected from the group consisting of a video camera, a still camera, a head-mounted display, a car navigation apparatus, a personal computer, a portable information terminal, a mobile computer and a cellular telephone.

11. A semiconductor device having at least one nonvolatile memory, said nonvolatile memory comprising:
a plurality of memory cells arranged in a matrix form, each of said memory cells including a memory element and a switching element;
said memory element comprising:
a first semiconductor layer formed over a substrate, said first semiconductor layer having first source and drain regions and a first channel region therebetween;
a first gate insulating film formed over said first channel region;
a floating gate electrode formed over said first gate insulating film;
an insulating film formed over said floating gate electrode; and
a control gate electrode formed over said insulating film,
said switching element comprising:
a second semiconductor layer formed over said substrate, said second semiconductor layer having second source and drain regions and a second channel region therebetween;
a second gate insulating film formed over said second channel region; and
a gate electrode formed over said second gate insulating film,
wherein a thickness of said first semiconductor layer is smaller than that of said second semiconductor layer.

12. A semiconductor device according to claim 11, wherein said first semiconductor layer and said second semiconductor layer have thicknesses of 1–50 nm and 40–100 nm, respectively.

13. A semiconductor device according to claim 11, wherein said first semiconductor layer has a thickness of 10–40 nm.

14. A semiconductor device according to claim 11, wherein said first semiconductor layer has a thickness so that impact ionization occurs more easily than said second semiconductor layer.

15. A semiconductor device according to claim 11, said semiconductor device is selected from the group consisting of a video camera, a still camera, a head-mounted display, a car navigation apparatus, a personal computer, a portable information terminal, a mobile computer and a cellular telephone.

16. A semiconductor device having at least one nonvolatile memory, said nonvolatile memory comprising:
a plurality of memory cells arranged in a matrix form, each of said memory cells including a memory element and a switching element;
said memory element comprising:
a first semiconductor layer formed over a substrate, said first semiconductor layer having first source and drain regions and a first channel region therebetween;
a first gate insulating film formed over said first channel region;
a floating gate electrode formed over said first gate insulating film;
an insulating film formed over said floating gate electrode; and
a control gate electrode formed over said insulating film,
said switching element comprising:
a second semiconductor layer formed over said substrate, said second semiconductor layer having second source and drain regions and a second channel region therebetween;
a second gate insulating film formed over said second channel region; and
a gate electrode formed over said second gate insulating film,
wherein a thickness of said first semiconductor layer is smaller than that of said second semiconductor layer,
wherein an impurity region is formed between said channel region and at least one of said second source and drain regions.

17. A semiconductor device according to claim 16, wherein said first semiconductor layer and said second semiconductor layer have thicknesses of 1–50 nm and 40–100 nm, respectively.

18. A semiconductor device according to claim 16, wherein said first semiconductor layer has a thickness of 10–40 mm.

19. A semiconductor device according to claim 16, wherein said first semiconductor layer has a thickness so that impact ionization occurs more easily than said second semiconductor layer.

20. A semiconductor device according to claim 16, said semiconductor device is selected from the group consisting of a video camera, a still camera, a head-mounted display, a car navigation apparatus, a personal computer, a portable information terminal, a mobile computer and a cellular telephone.

21. A semiconductor device having at least one nonvolatile memory, said nonvolatile memory comprising:
a plurality of memory cells arranged in a matrix form, each of said memory cells including a memory element and a switching element;
said memory element comprising:
a first semiconductor layer formed over a substrate;
a first gate insulating film formed over said first semiconductor layer;
a floating gate electrode formed over said first gate insulating film;
an insulating film formed over said floating gate electrode; and
a control gate electrode formed over said insulating film,
said switching element comprising:
a second semiconductor layer formed over said substrate;
a second gate insulating film formed over said second semiconductor layer; and
a gate electrode formed over said second gate insulating film, wherein a thickness of said first semiconductor layer is smaller than that of said second semiconductor layer, wherein subthreshold coefficient of said switching element is 60–100 mV/decade.

22. A semiconductor device according to claim 21, wherein said first semiconductor layer and said second semiconductor layer have thicknesses of 1–50 nm and 40–100 nm, respectively.

23. A semiconductor device according to claim 21, wherein said first semiconductor layer has a thickness of 10–40 nm.

24. A semiconductor device according to claim 21, wherein said first semiconductor layer has a thickness so that impact ionization occurs more easily than said second semiconductor layer.

25. A semiconductor device according to claim 21, said semiconductor device is selected from the group consisting of a video camera, a still camera, a head-mounted display, a car navigation apparatus, a personal computer, a portable information terminal, a mobile computer and a cellular telephone.

26. A semiconductor device having at least one nonvolatile memory, said nonvolatile memory comprising:

a plurality of memory cells arranged in a matrix form, each of said memory cells including a memory element and a switching element;

said memory element comprising:
a first semiconductor layer formed over a substrate;
a first gate insulating film formed over said first semiconductor layer;
a floating gate electrode formed over said first gate insulating film;
an insulating film formed over said floating gate electrode; and
a control gate electrode formed over said insulating film, said switching element comprising:
a second semiconductor layer formed over said substrate;
a second gate insulating film formed over said second semiconductor layer; and
a gate electrode formed over said second gate insulating film, wherein a thickness of said first semiconductor layer is smaller than a thickness of said second semiconductor layer, and wherein a tunnel current flowing through said first semiconductor layer is two times or more larger than the tunnel current flowing through said second semiconductor layer.

27. A semiconductor device according to claim 26, wherein said first semiconductor layer and said second semiconductor layer have thicknesses of 1–50 nm and 40–100 nm, respectively.

28. A semiconductor device according to claim 26, wherein said first semiconductor layer has a thickness of 10–40 nm.

29. A semiconductor device according to claim 26, wherein said first semiconductor layer has a thickness so that impact ionization occurs more easily than said second semiconductor layer.

30. A semiconductor device according to claim 26, said semiconductor device is selected from the group consisting of a video camera, a still camera, a head-mounted display, a car navigation apparatus, a personal computer, a portable information terminal, a mobile computer and a cellular telephone.

* * * * *

UNITED STATES PATENT AND TRADEMARK OFFICE
CERTIFICATE OF CORRECTION

PATENT NO.   : 6,509,602 B2
DATED        : January 21, 2003
INVENTOR(S)  : Yamazaki, Shumpei It is certified that error appears in the above-identified patent and that said Letters Patent is hereby corrected as shown below:

<u>Title page,</u>
Item [56], References Cited, OTHER PUBLICATIONS, add the following:
-- Shimokawa, R. et al., "Characterization of High-Efficiency Cast-Si Solar Cell Wafers by MBIC Measurement", pp. 751-758, May 1988, Japanese Journal of Applied Physics, Vol. 27, No. 5 --

Signed and Sealed this

Eighteenth Day of February, 2003

JAMES E. ROGAN
*Director of the United States Patent and Trademark Office*